(12) United States Patent
Kim et al.

(10) Patent No.: US 8,809,926 B2
(45) Date of Patent: Aug. 19, 2014

(54) SEMICONDUCTOR MEMORY DEVICES INCLUDING VERTICAL TRANSISTOR STRUCTURES

(75) Inventors: Sua Kim, Seongnam-si (KR); Jin Ho Kim, Uiwang-si (KR); Chulwoo Park, Yongin-si (KR); Sangbo Lee, Yongin-si (KR); Hongsun Hwang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 3 days.

(21) Appl. No.: 13/605,275

(22) Filed: Sep. 6, 2012

(65) Prior Publication Data

US 2013/0056812 A1    Mar. 7, 2013

(30) Foreign Application Priority Data

Sep. 7, 2011    (KR) .................. 10-2011-0090545

(51) Int. Cl.
*H01L 21/02*    (2006.01)
(52) U.S. Cl.
USPC ........... 257/295; 438/262; 257/302; 257/328; 257/329; 257/330; 257/331; 257/332; 257/333; 257/334; 257/E29.131; 257/E29.323
(58) Field of Classification Search
CPC ............ H01L 29/7827; H01L 29/66666; H01L 27/10885; H01L 27/10876
USPC .......... 257/295, E29.323, 302, 328, E29.131, 257/329, 330, 331, 332, 333, 334; 438/262
See application file for complete search history.

(56) References Cited

U.S. PATENT DOCUMENTS

| | | | |
|---|---|---|---|
| 7,486,576 B2 | 2/2009 | Choi et al. | |
| 7,579,614 B2 | 8/2009 | Asao | |
| 8,084,805 B2 * | 12/2011 | Shim et al. | 257/314 |
| 8,264,865 B2 * | 9/2012 | Mitani et al. | 365/148 |
| 8,344,437 B2 * | 1/2013 | Kim et al. | 257/302 |
| 8,384,141 B2 * | 2/2013 | Kim et al. | 257/302 |
| 2007/0145464 A1 * | 6/2007 | Voshell et al. | 257/314 |
| 2008/0035958 A1 * | 2/2008 | Asao | 257/204 |
| 2008/0209118 A1 | 8/2008 | Kajiyama | |
| 2008/0242025 A1 * | 10/2008 | Kim et al. | 438/262 |
| 2009/0129141 A1 | 5/2009 | Hosotani et al. | |
| 2010/0059837 A1 * | 3/2010 | Kim et al. | 257/421 |
| 2010/0109061 A1 | 5/2010 | Kushida | |
| 2011/0002154 A1 * | 1/2011 | Mitani et al. | 365/148 |
| 2012/0241826 A1 * | 9/2012 | Satoh et al. | 257/295 |
| 2013/0043525 A1 * | 2/2013 | Yu et al. | 257/329 |
| 2013/0099305 A1 * | 4/2013 | Kim et al. | 257/329 |

FOREIGN PATENT DOCUMENTS

| | | |
|---|---|---|
| JP | 2006-127648 | 5/2006 |
| JP | 2008-042090 | 2/2008 |
| JP | 2008-218514 | 9/2008 |
| JP | 2009-129491 | 6/2009 |
| JP | 2010-114143 | 5/2010 |
| KR | 1020050004479 | 1/2005 |
| KR | 1020090052815 | 5/2009 |
| WO | WO 2010004705 A1 * | 1/2010 |

\* cited by examiner

*Primary Examiner* — Matthew W Such
*Assistant Examiner* — Samuel Lair
(74) *Attorney, Agent, or Firm* — Myers Bigel Sibley & Sajovec, P.A.

(57) ABSTRACT

A semiconductor memory device may include a common source region on a substrate, an active pattern between the substrate and the common source region, a gate pattern facing a sidewall of the active pattern, a gate dielectric pattern between the gate pattern and the active pattern, a variable resistance pattern between the common source region and the active pattern, and an interconnection line.

21 Claims, 18 Drawing Sheets

SEMICONDUCTOR MEMORY DEVICES INCLUDING VERTICAL TRANSISTOR STRUCTURES

CROSS-REFERENCE TO RELATED APPLICATIONS

This U.S. non-provisional patent application claims priority under 35 U.S.C. §119 to Korean Patent Application No. 10-2011-0090545, filed on Sep. 7, 2011, in the Korean Intellectual Property Office, the entire disclosure of which is hereby incorporated herein by reference.

BACKGROUND OF THE INVENTION

Embodiments of inventive concepts relate generally to semiconductor devices, and more particularly, to semiconductor devices including vertical channel transistors.

Due to small-size, multifunctional, and/or low-cost characteristics, semiconductor devices are considered important elements in the electronics industry. A semiconductor memory device is a type of semiconductor device configured to store and read out digitized data. Semiconductor devices may be classified as volatile memory devices or as nonvolatile memory devices. Volatile memory devices may lose stored data when power is interrupted. Volatile memory devices may, for example, include dynamic random access memory (DRAM) devices and static random access memory (SRAM) devices. Nonvolatile memory devices may maintain stored data even when power is interrupted. Nonvolatile memory devices may, for example, include FLASH memory devices.

High capacity semiconductor Memory devices may be used to satisfy consumer demand for increased performance and reduced price. In the case of semiconductor memory devices, increased integration may be desired, because integration is a significant factor in determining product price. However, expensive process equipment that may be needed to reduce pattern dimensions may set a practical limit on increasing integration for semiconductor memory devices. To address such issues, there have been a variety of studies on new technologies to increase integration density of semiconductor memory devices.

SUMMARY

Embodiments of inventive concepts may provide increased density semiconductor memory devices.

Other embodiments of inventive concepts may provide semiconductor memory devices with increased reliability.

According to examples of embodiments of inventive concepts, a semiconductor memory device may include a common source region on a substrate, and an active pattern between the substrate and the common source region. The active pattern may include a first doped region and a second doped region, which may be spaced apart from each other in a direction normal to a top surface of the substrate. A channel region may be interposed between the first and second doped regions. A gate pattern may be disposed to face a sidewall of the active pattern, a gate dielectric pattern may be interposed between the gate pattern and the active pattern, a variable resistance pattern may be interposed between the common source region and the active pattern and connected to the second doped region, and an interconnection line may be connected to the first doped region.

In some embodiments, the device may further include a conductive pattern facing another sidewall of the active pattern that may be opposite to the gate pattern.

In some embodiments, the conductive pattern may be connected to the substrate.

In some embodiments, the variable resistance pattern may be a magnetic tunnel junction.

In some embodiments, the device may further include a word line connected to the gate pattern to cross the interconnection line.

In some embodiments, the active pattern and the gate pattern may be provided as a plurality of active patterns and a plurality of gate patterns, and the active patterns and the gate patterns may be two-dimensionally arranged on the substrate along rows and columns, in a plan view. Each of the gate patterns may be disposed between the active patterns that may be adjacent to each other and parallel to the interconnection line. A pair of the active patterns may be disposed between a pair of the gate patterns that may be adjacent to each other and parallel to the interconnection line.

In some embodiments, the interconnection line may be provided as a plurality of interconnection lines. Each of the interconnection lines may be connected to a pair of the first doped regions disposed at both sides thereof, and each of the first doped regions may be solely connected to the corresponding one of the interconnection lines.

In some embodiments, the device may further include connecting portions interposed between the active patterns, with each of the connecting portions connecting the channel regions of the active patterns, arranged along a direction crossing the interconnection line.

In some embodiments, the device may further include a buried dielectric interposed between the substrate and the active patterns.

In some embodiments, the common source region may be connected to the variable resistance pattern.

According to other example embodiments of inventive concepts, a semiconductor memory device may include active patterns arranged two-dimensionally on a substrate, with each of the active patterns including a first doped region and a second doped region, which may be spaced apart from each other in a direction normal to a top surface of the substrate. A channel region may be interposed between the first and second doped regions, and a common source region may be interposed between the substrate and the active patterns. Each of a plurality of gate patterns may be disposed to face a sidewall of the corresponding one of the active patterns. Each of a plurality of word lines may be connected in common to the gate patterns arranged along a direction, on the substrate. Each of a plurality of variable resistance patterns may be connected to the second doped region of the corresponding one of the active patterns. Interconnection lines may be disposed to cross the word lines. Each of the interconnection lines may be connected to the variable resistance patterns arranged parallel to the word lines, and may connect portions disposed between the active patterns arranged parallel to the word lines.

In some embodiments, each of the connecting portions may connect the channel regions of the active patterns, which may be arranged parallel to the word lines.

In some embodiments, the device may further include gate dielectrics, each of which may be interposed between the corresponding one of the active patterns and the corresponding one of the gate patterns.

In some embodiments, the device may further include a gap-fill dielectric interposed between the substrate and the common source region.

In some embodiments, the common source region connects the first doped regions of the active patterns with each other.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1A:
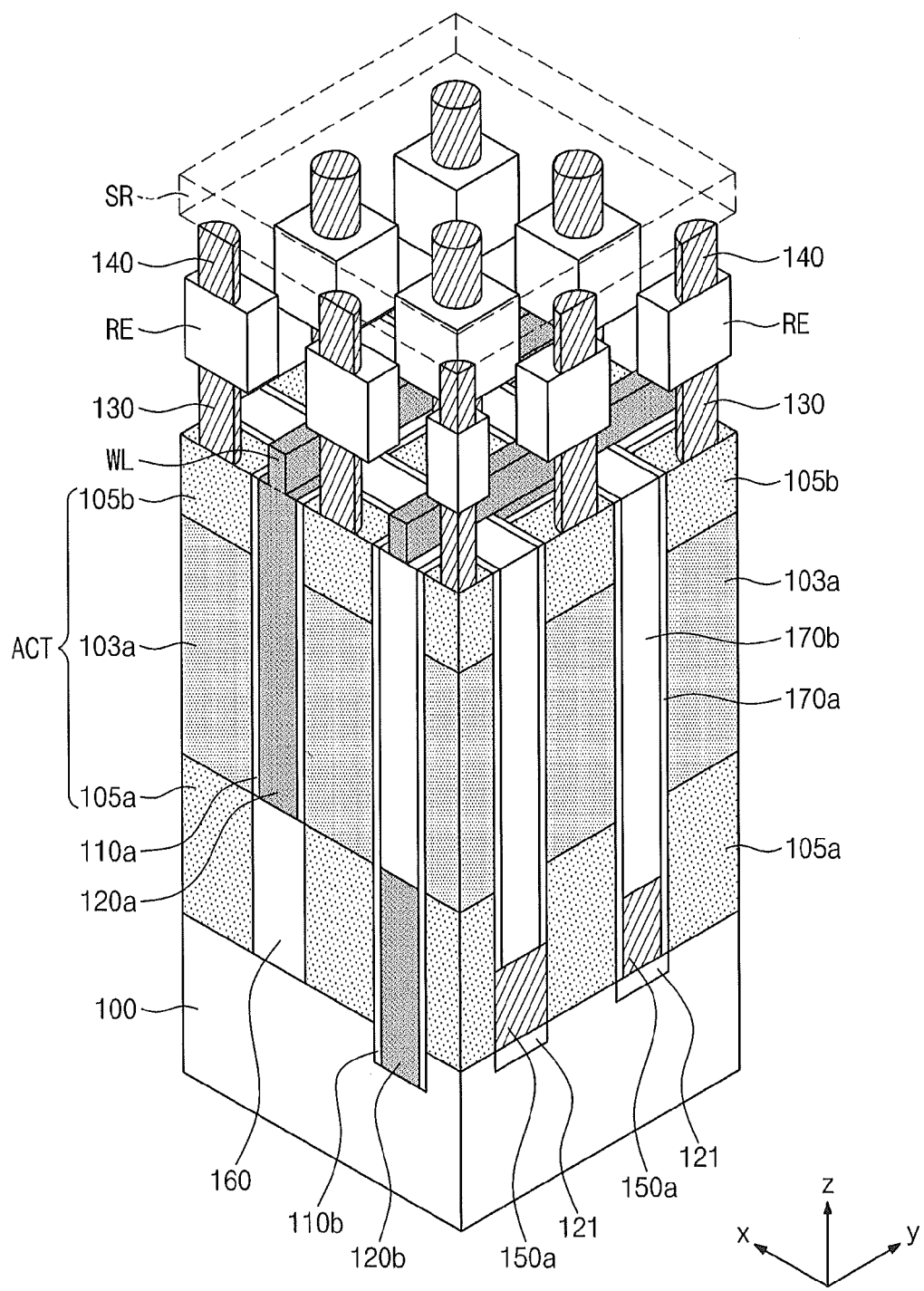
FIG. 1A is a perspective view of a semiconductor memory device according to example embodiments of inventive concepts.

It should be noted that these figures are intended to illustrate general characteristics of methods, structures and/or materials used in certain example embodiments and to supplement the written description provided below. These drawings are not, however, to scale and may not reflect precise structural or performance characteristics of any given embodiment, and should not be interpreted as defining or limiting the range of values or properties encompassed by example embodiments. For example, relative thicknesses and/or positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of inventive concepts will now be described more fully with reference to the accompanying drawings, in which example embodiments are shown. Example embodiments of inventive concepts may, however, be embodied in many different forms and should not be construed as being limited to the embodiments set forth herein; rather, these embodiments are provided so that this disclosure will be thorough and complete, and will fully convey concepts of example embodiments to those of ordinary skill in the art. In the drawings, thicknesses of layers and regions may be exaggerated for clarity. Like reference numerals in the drawings denote like elements, and thus their repeated description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted regions. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
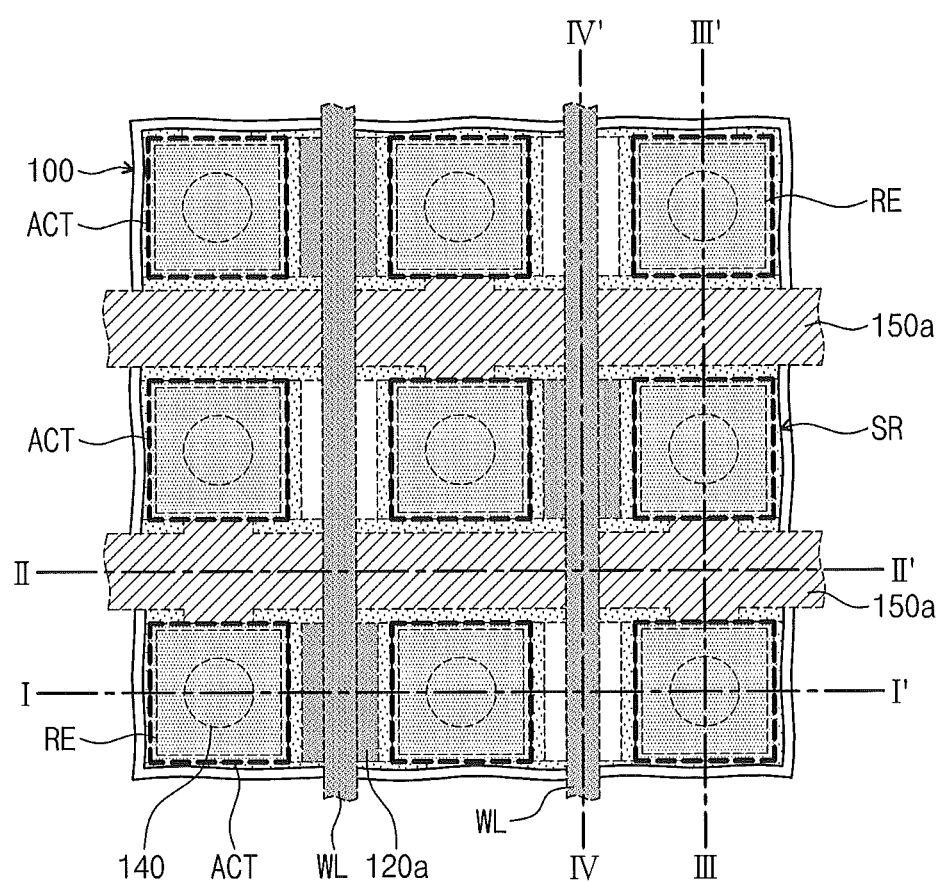
FIG. 1B is a plan view of the semiconductor memory device according to example embodiments of inventive concepts.
Figure 1C:
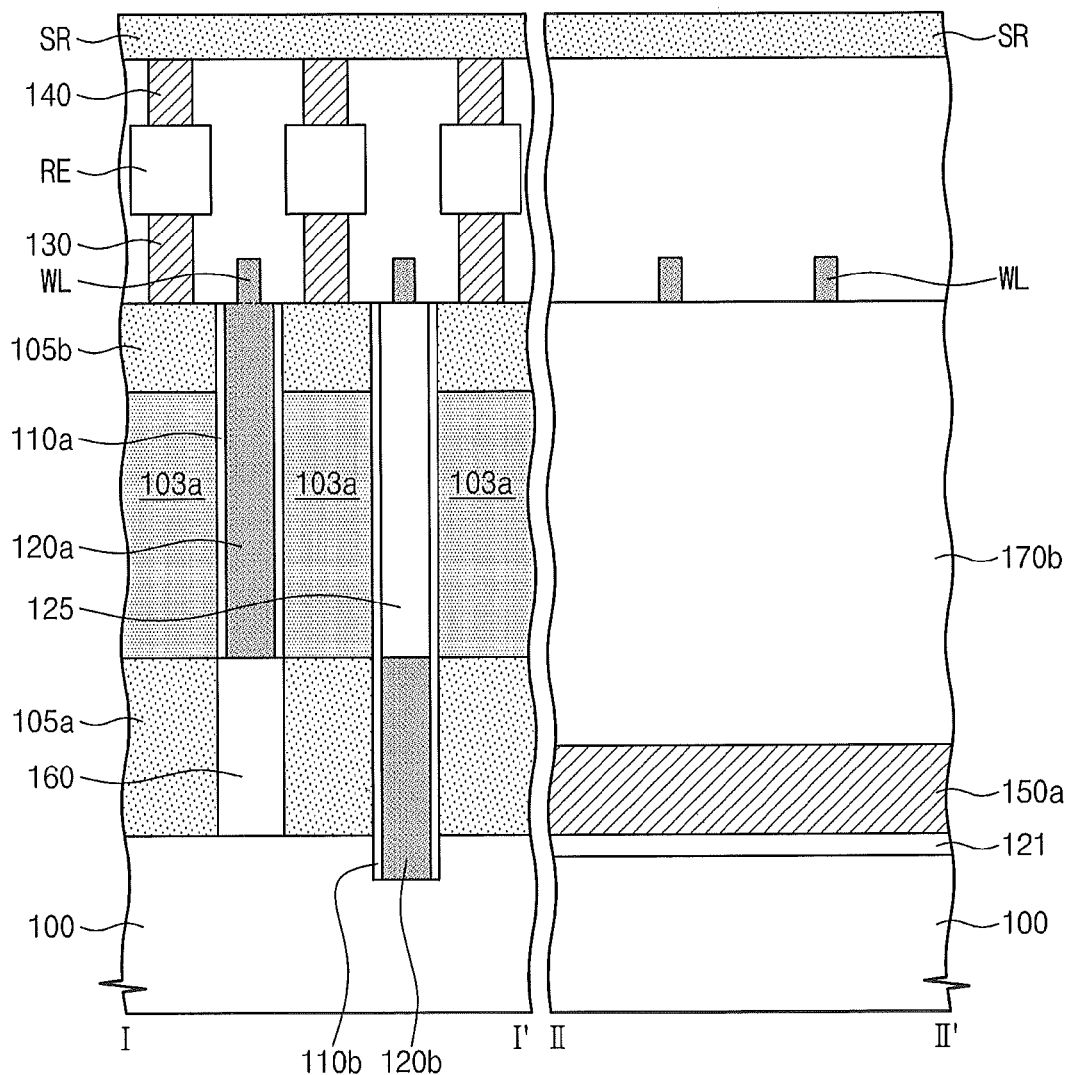
FIGS. 1C and 1D are sectional views taken along lines I-I', II-II', III-III', and IV-IV' of FIG. 1B.
Figure 1D:
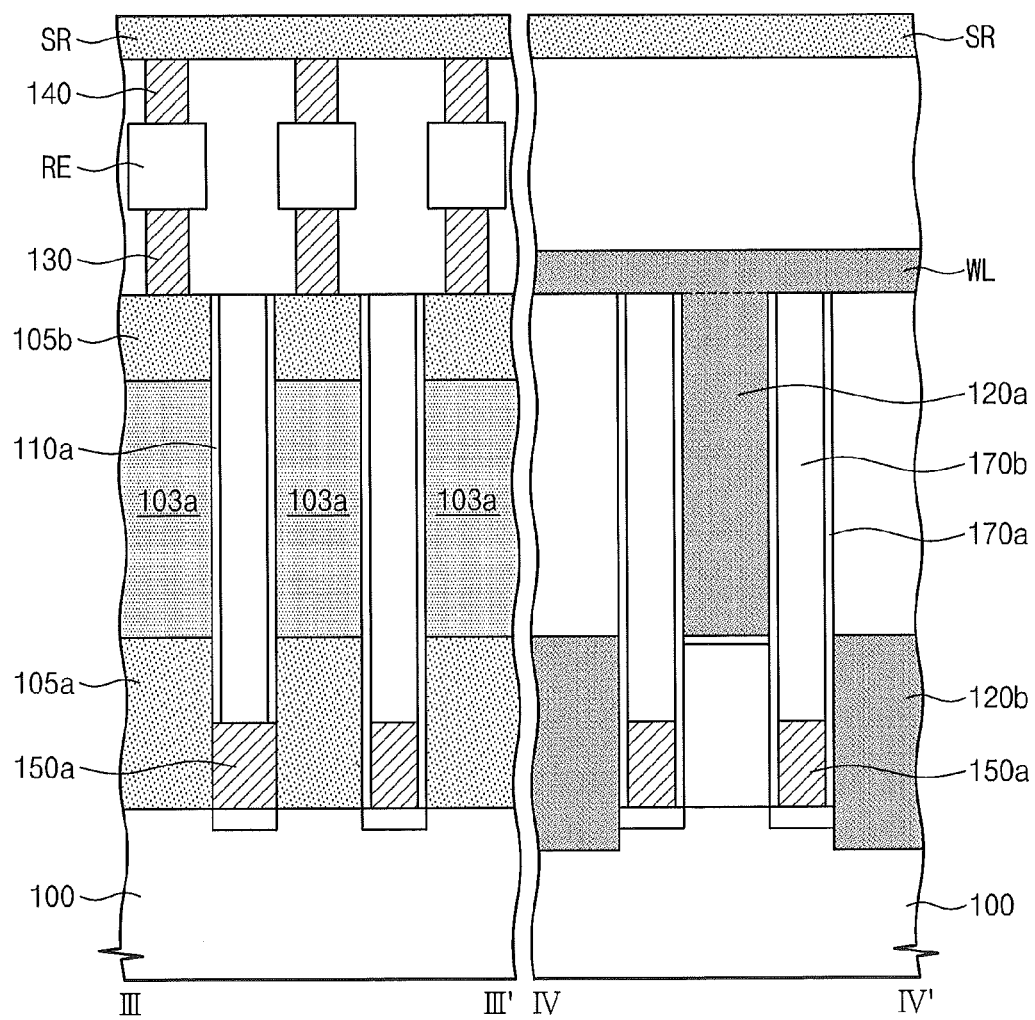

Hereinafter, a semiconductor memory device according to example embodiments of inventive concepts will be described with reference to FIGS. 1A through 1E, FIG. 1A is a perspective view of a semiconductor memory device according to example embodiments of inventive concepts, FIG. 1B is a plan view of the semiconductor memory device according to example embodiments of inventive concepts, and FIGS. 1C and 1D are sectional views taken along lines I-I', II-II', III-III', and IV-IV' of FIG. 1B.

Referring to FIG. 1A through FIG. 1E, a plurality of active patterns ACT may be provided on a substrate 100. The active patterns ACT may be formed to have a shape protruding upward from the substrate 100. In plan view, the active patterns ACT may be two-dimensionally arranged along rows and columns. In some embodiments, the rows and the columns may be parallel to a first direction (or x axis of FIG. 1A) and a second direction (or y axis of FIG. 1A), respectively.

Each of the active patterns ACT may include a first doped region 105a, a channel region 103a, and a second doped region 105b, which are vertically stacked on the substrate 100. In other words, the first and second doped regions 105a and 105b may be spaced apart from each other in a vertical direction, which is normal to a top surface of the substrate 100, and the channel region 103a may be interposed between the first and second doped regions 105a and 105b. In some embodiments, the first doped region 105a may be provided in a lower portion of the active pattern ACT, and the second doped region 105b may be provided in an upper portion of the active pattern ACT.

In some embodiments, the substrate 100 may have a first conductivity type, and the first and second doped regions 105a and 105b may have a second conductivity type different from the first conductivity type. For example, in the case in which the substrate 100 is p-type, the first and second doped regions 105a and 105b are n-type. The channel region 103a may be formed to have the same conductivity type (i.e., the first conductivity type) as the substrate 100.

The first and second doped regions 105a and 105b and the channel region 103a may be used as portions of a single vertical channel transistor. For example, the first and second doped regions 105a and 105b may serve as source/drain regions of the vertical channel transistor, and the channel region 103a may serve as a channel region of the vertical channel transistor.

Gate patterns 120a may be provided between the active patterns ACT arranged along the first direction. Each of the gate patterns 120a may face sidewalls of a respective pair of the active patterns ACT disposed adjacent thereto and may thus be used as a common gate electrode for pairs of the vertical channel transistors arranged along the first direction.

The gate patterns 120a may be two-dimensionally arranged on the substrate 100, in plan view. In some embodiments, the gate patterns 120a positioned on each pair of adjacent columns may be arranged in a zigzag manner. In some aspects of inventive concepts, the active patterns ACT may include a plurality of group, each of which includes a pair of the active patterns disposed adjacent to each other in the first direction, and in this case, each of the gate patterns 120a may be disposed between the active patterns constituting the corresponding one of the groups. In addition, between a pair of the gate patterns 120a adjacent to each other in the first direction, there may be a pair of the active patterns constituting two groups different from each other.

In other words, the gate patterns 120a may be alternatingly disposed on two opposite sidewalls of the active patterns ACT that are one-dimensionally arranged along the second direction. For example, some of the gate patterns 120a, which are disposed adjacent to odd-numbered ones of the active patterns ACT arranged along the second direction, may be disposed to face left sidewalls of the active patterns ACT, while the others of the gate patterns 120a, which are disposed adjacent to even-numbered ones, may be disposed to face right sidewalls of the active patterns ACT. In some aspects of present embodiments, the gate patterns 120a, which are disposed between two rows of the active patterns ACT, may be disposed between even- or odd-numbered pairs of the active patterns ACT in the second direction.

Each of the gate patterns 120a may be shaped like a plug or pillar, and a bottom surface of each of the gate patterns 120a may be located at a level equivalent to or lower than a top surface of the first doped region 105a. Furthermore, the bottom surface of each of the gate patterns 120a may be located at a level higher than a bottom surface of the first doped region 105a.

The gate patterns 120a may include at least one material selected from the group consisting of a doped semiconductor (e.g., doped silicon, doped germanium, doped silicon-germanium, etc.), a conductive metal nitride (e.g., titanium nitride, tantalum nitride, etc.), a transition metal (e.g., titanium, tantalum, etc.), or a metal (e.g., tungsten), but example embodiments of inventive concepts may not be limited thereto.

Gate dielectric patterns 110a may be provided between the gate patterns 120a and the active patterns ACT, respectively. In some embodiments, the gate dielectric pattern 110a may include a thermal oxide. However, example embodiments of inventive concepts may not be limited thereto. For example, the gate dielectric pattern 110a may include at least one material selected from the group consisting of oxides, nitrides, oxynitrides, and/or high-k dielectric materials. The high-k dielectric material may include an insulating material whose dielectric constant is higher than that of silicon nitride.

For example, the high-k dielectric material may be at least one material selected from the group consisting of an insulating metal oxide, such as hafnium oxide and/or aluminum oxide.

A plurality of word lines WL may be provided parallel to the second direction on the substrate 100. Each of the word lines WL may be connected to the gate patterns 120a arranged along a respective one of the columns. The word lines WL may include at least one material selected from the group consisting of a doped semiconductor (e.g., doped silicon, doped germanium, doped silicon-germanium, etc.), a conductive metal nitride (e.g., titanium nitride, tantalum nitride, etc.), a transition metal (e.g., titanium, tantalum, etc.), or a metal (e.g., tungsten), but example embodiments of inventive concepts may not be limited thereto. In some embodiments, the word lines WL may include the same material as the gate patterns 120a.

Conductive patterns 120b may be provided between the active patterns ACT. The conductive patterns 120b may be disposed to face a sidewall of the active pattern ACT that is opposite to the gate pattern 120a. In plan view, the conductive patterns 120b may be two-dimensionally arranged along the rows and the columns. In some embodiments, the conductive patterns 120b, which are arranged along a specific column parallel to the second direction, may be disposed between the gate patterns 120a, which are arranged along the same column, respectively. In some embodiments, the conductive patterns 120b may be connected to the substrate 100 to enable application of a specific voltage to the conductive patterns 120b through the substrate 100.

A bottom surface of the conductive pattern 120b may be located at a level lower than the bottom surface of the first doped region 105a. In addition, a top surface of each conductive pattern 120b may be located at the same level as the top surface of the first doped region 105a. Unlike shown in the drawings, the top surface of each conductive pattern 120b may be located at a level higher than the top surface of the first doped region 105a.

The conductive patterns 120b may include at least one material selected from the group consisting of a doped semiconductor (e.g., doped silicon, doped germanium, doped silicon-germanium, etc.), a conductive metal nitride (e.g., titanium nitride, tantalum nitride, etc.), a transition metal (e.g., titanium, tantalum, etc.) or a metal (e.g., tungsten), but example embodiments of inventive concepts may not be limited thereto.

Figure 1E:
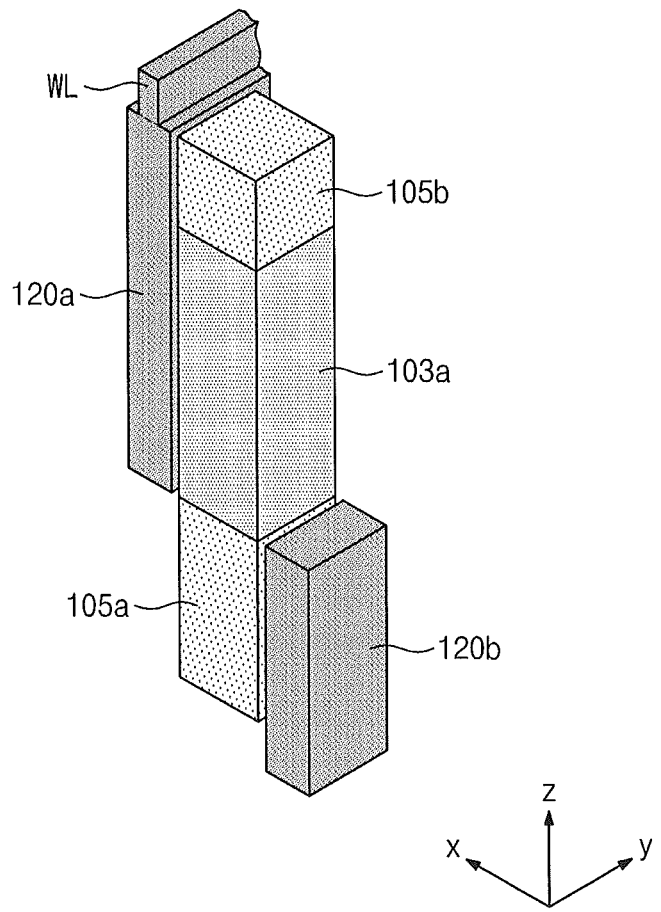
FIG. 1E is a partial perspective view illustrating an active pattern, a gate pattern, a word line and a conductive pattern of a semiconductor memory device according to example embodiments of inventive concepts.

FIG. 1E is a partial perspective view illustrating an active pattern ACT, a gate pattern 120a, a word line WL and a conductive pattern 120b of the semiconductor memory device according to example embodiments of inventive concepts. Referring to FIG. 1E, one active pattern ACT may be disposed between one gate pattern 120a and one conductive pattern 120b. The gate pattern 120a may face a sidewall of the active pattern ACT. The first and second doped regions 105a and 105b and the channel region 103a may be used as portions of one vertical channel transistor, and the gate pattern 120c may be used as a gate electrode of the vertical channel transistor. The conductive pattern 120b may be disposed adjacent to the first doped region 105a of the active pattern ACT to face the other sidewall of the active pattern ACT opposite to the gate pattern 120a. Due to the presence of the conductive pattern 120b, an inversion region can be induced in a surface of the first doped region 105a adjacent to the conductive pattern 120b, during an operation of the semiconductor memory device. As shown, the gate pattern 120a and the conductive pattern 120b may be disposed spaced apart from the active pattern ACT.

In the case in which the first and second doped regions 105a and 105b and the channel region 103a constitute a vertical type NMOS transistor, the channel region 103a may be electrically separated from the substrate by the first doped region and may be in a floating state. This may cause a floating body effect. For example, holes may accumulate in the channel region 103a through, for example, a gate induced drain leakage (GIDL), and the accumulated holes may change a threshold voltage of the vertical channel transistor. However, according to example embodiments of inventive concepts, an inversion region can be induced in the first doped region 105a by, for example, applying a negative voltage to the conductive pattern 120b. In this case, the accumulated holes can be discharged through the inversion region of the first doped region 105a. The conductive pattern 120b may reduce and/or prevent occurrence of the floating body effect from occurring in the vertical channel transistor according to example embodiments of inventive concepts. As a result, it may be possible to provide increased reliability in semiconductor memory devices.

A dielectric pattern 110b may be provided between the conductive pattern 120b and the active pattern ACT. The dielectric pattern 110b may include a thermal oxide. However, example embodiments of inventive concepts may not be limited thereto. For example, the dielectric pattern 110b may include at least one material selected from the group consisting of oxides, nitrides, oxynitride, and/or high-k dielectric materials. The high-k dielectric material may include insulating materials whose dielectric constant is higher than that of silicon nitride. For example, the high-k dielectric material may be at least one material selected from the group consisting of an insulating metal oxide, such as hafnium oxide and/or aluminum oxide.

First dielectric gap-filling patterns 160 may be provided between the first doped regions 105a and the substrate 100. The first dielectric gap-filling patterns 160 may also be provided between the gate patterns 120a and the substrate 100. The first dielectric gap-filling patterns 160 may include at least one of oxide, nitride, and/or oxynitride.

A plurality of interconnection lines 150a may be provided parallel to each other on the substrate 100. In some embodiments, the interconnection lines 150a may be disposed to cross the word lines WL, in plan view. Each of the interconnection lines 150a may be disposed between two rows, adjacent to each other in the second direction, of the active patterns ACT. In other words, between a pair of the interconnection lines 150a disposed adjacent to each other, there may be a plurality of the active patterns ACT arranged along a row.

The interconnection lines 150a may be connected to the first doped regions 105a. A pair of the first doped regions 105a, which are disposed adjacent to each other in the second direction, may be connected to the corresponding one of the interconnection lines 150a.

Each of the first doped regions 105a may be electrically connected to a respective one of the interconnection lines 150a but be electrically isolated from the others of interconnection lines 150a. For example, in a specific row of the active patterns ACT arranged parallel to the first direction, the first doped regions 105a thereof may be alternatingly connected to one of a pair of the interconnection lines 150a disposed adjacent thereto. In more detail, even-numbered ones of the first doped regions 105a thereof may be connected to a left one of a pair of the interconnection lines 150a disposed adjacent thereto, and odd-numbered ones of the first doped regions 105a thereof may be connected to a right one of a pair of the interconnection lines 150a disposed adjacent thereto. In addition, for two rows of the first doped regions 105a parallel to the first direction and one interconnection line 150a interposed therebetween, for example, the interconnection line 150a may be electrically connected to even-numbered ones of the first doped regions 105a but be electrically spaced apart from odd-numbered ones of the first doped regions 105a.

The interconnection lines 150a may include at least one material selected from the group consisting of a metal (e.g., tungsten), a conductive metal nitride (e.g., titanium nitride, tantalum nitride, etc.), and/or a transition metal (e.g., titanium, tantalum, etc.), but example embodiments of inventive concepts may not be limited thereto.

A dielectric liner 170a and a second dielectric gap-filling pattern 170b may be provided between the active patterns ACT disposed adjacent to each other in the second direction. In some embodiments, a portion of the dielectric liner 170a may extend toward the substrate between the interconnection line 150a and the first doped region 150a of the active pattern ACT. The second dielectric gap-filling pattern 170b may be disposed on the interconnection lines 150a. Each of the dielectric liner 170a and the second dielectric gap-filling pattern 170b may include at least one of oxide, nitride, and/or oxynitride.

A lower dielectric pattern 121 may be provided between the interconnection lines 150a and the substrate 100 to electrically isolate the interconnection lines 150a from the substrate 100. The lower dielectric pattern 121 may include at least one of oxide, nitride, and/or oxynitride.

A common source region SR may be provided on respective active patterns ACT, and a plurality of variable resistance patterns RE may be provided between the active patterns ACT and the common source region SR. The common source region SR may be formed of at least one of a metallic material and/or a doped semiconductor, but example embodiments of inventive concepts may not be limited thereto.

Each of the variable resistance patterns RE may be connected to a respective second doped region 105b of the corresponding one of the active patterns ACT. In some embodiments, unlike shown in the drawings, the variable resistance pattern RE may be shaped like a line or a plate. In this case, a plurality of the second doped regions 105b may be connected in common to the variable resistance pattern RE provided as a single body. The variable resistance patterns RE may serve as information storing elements for the semiconductor memory device according to example embodiments of inventive concepts. In some embodiments, each variable resistance pattern RE may be a magnetic tunnel junction (MTJ) and/or may be formed of a material exhibiting a variable resistance property.

First contact plugs 130 may be provided between the variable resistance patterns RE and the second doped regions 105b, respectively, and second contact plugs 140 may be provided on the variable resistance patterns RE, respectively. Each of the first contact plugs 130 may be disposed between a respective one of the variable resistance patterns RE and a respective one of the second doped regions 105b. As a result, each of the variable resistance patterns RE may be connected to the second doped region 105b of the corresponding one of the active patterns ACT via the corresponding one of the first contact plugs 130. The plurality of variable resistance patterns RE may be connected in common to the common source region SR via the second contact plugs 140. In other embodiments, the first contact plugs 130 and/or the second contact plugs 140 may be omitted, but example embodiments of inventive concepts may not be limited thereto.

The first and second contact plugs 140 may include at least one material selected from the group consisting of a semiconductor (e.g., polysilicon), a metal (e.g., tungsten), a conductive metal nitride (e.g., titanium nitride, tantalum nitride, etc.), or a transition metal (e.g., titanium, tantalum, etc.), but example embodiments of inventive concepts may not be limited thereto.

Figure 2A:
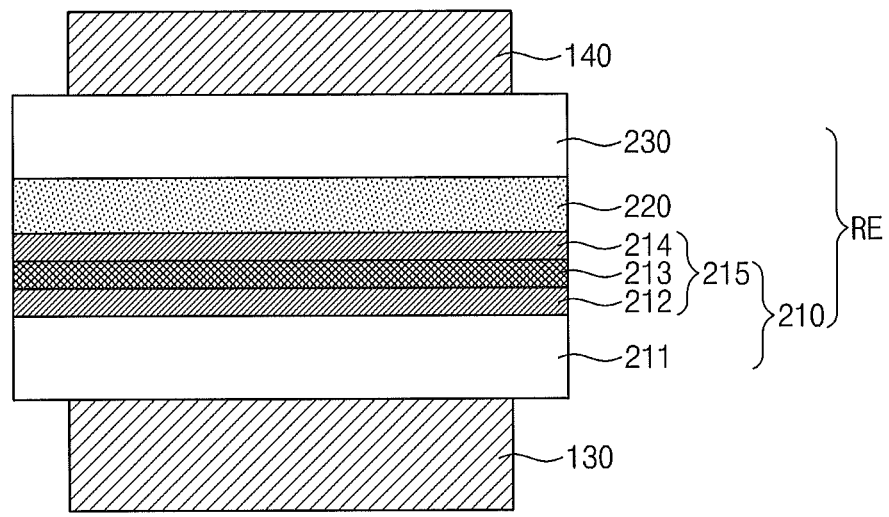
FIGS. 2A and 2B are enlarged sectional views exemplarily illustrating a variable resistance pattern of the semiconductor memory device according to example embodiments of inventive concepts.
Figure 2B:
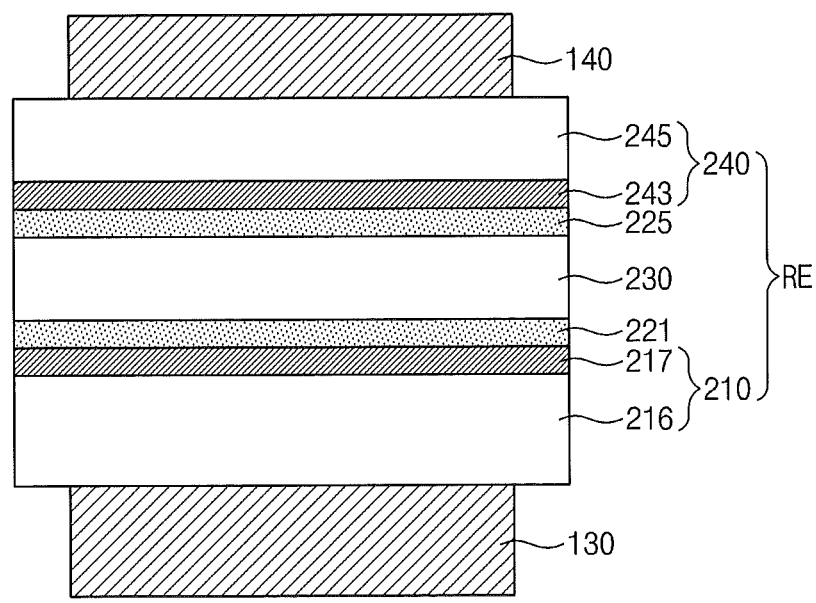

FIGS. 2A and 2B are enlarged sectional views illustrating some examples of the variable resistance pattern RE.

Referring to FIG. 2A, each of the variable resistance patterns RE may include a first conductive magnetic layer 210 and a second conductive magnetic layer 230 sequentially stacked on the substrate 100. The first conductive magnetic layer 210 may include a pinning layer 211 and a pinned layer 215. The pinning layer 211 may include an anti-ferromagnetic material. The pinning layer 211 may include at least one material selected from the group consisting of PtMn, IrMn, MnO, MnS, MnTe, $MnF_2$, $FeCl_2$, FeO, $CoCl_2$, CoO, $NiCl_2$, NiO and/or Cr. In some embodiments, the pinning layer 211 may include at least one of a precious metal and/or a rare-earth element. For example, the pinning layer 211 may include at least one material selected from the group consisting of Ru, Rh, Pd, Os, Ir, Pt, Au, and/or Ag.

The pinned layer 215 may be configured to have a magnetization direction fixed by the pinning layer 211. The pinned layer 215 may include a ferromagnetic material. For example, the pinned layer 215 may include a first ferromagnetic layer 212, a second ferromagnetic layer 214, and a non-magnetic layer 213 between the first and second ferromagnetic layers 212 and 214. In some embodiments, the first ferromagnetic layer 212 may have a magnetization direction fixed by the pinning layer 211, while a magnetization direction of the second ferromagnetic layer 214 may be fixed to be anti-parallel to that of the first ferromagnetic layer 212 due to the presence of the non-magnetic layer 213.

Each of the first and second ferromagnetic layers 212 and 214 may include at least one ferromagnetic material. For example, each of the first ferromagnetic layer 212 and second ferromagnetic layer 214 may include at least one material selected from the group consisting of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and/or $Y_3Fe_5O_{12}$. The non-magnetic layer 213 may include at least one of a precious metal or rare-earth element. For example, the non-magnetic layer 213 may be formed of at least one of Ru, Ir, and/or Rh.

The second conductive magnetic layer 230 may include a material having a switchable magnetization direction. According to example embodiments of inventive concepts, the magnetization direction of the second conductive magnetic layer 230 may be switched using an electromagnetic interaction exerted on the variable resistance pattern RE. Electrical resistance of the variable resistance pattern RE may vary, depending on whether or not magnetization directions of the first and second conductive magnetic layers 210 and 230 are parallel to each other. According to example embodiments of inventive concepts, an operation of writing and/or reading data in the semiconductor memory device may be performed on the basis of this phenomenon. The second conductive magnetic layer 230 may include a ferromagnetic material. For example, the second conductive magnetic layer 230 may include at least one material selected from the group consisting of FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and/or $Y_3Fe_5O_{12}$.

The second conductive magnetic layer 230 may include a plurality of layers. For example, the second conductive magnetic layer 230 may include a plurality of ferromagnetic layers and at least one non-magnetic layer interposed between the ferromagnetic layers. In this case, the ferromagnetic layers and the non-magnetic layer(s) may constitute a synthetic antiferromagnetic layer, allowing improved characteristics of the semiconductor memory device, (for example, improved threshold current density and/or thermal stability). In some embodiments, the first and second conductive magnetic layers 210 and 230 may be configured to have magnetization directions substantially parallel to the top surface of the substrate 100.

A tunnel barrier layer 220 may be interposed between the first and second conductive magnetic layers 210 and 230. The tunnel barrier layer 220 may be a material including a metallic element and a non-metallic element. For example, the tunnel barrier layer 220 may include at least one material selected from the group consisting of magnesium oxide, titanium oxide, aluminum oxide, magnesium-zinc oxide, magnesium-boron oxide, titanium nitride, and/or vanadium nitride. In some embodiments, the tunnel barrier layer 220 may be formed of magnesium oxide. In other embodiments, the tunnel barrier layer 220 may include a plurality of layers. For example, the tunnel barrier layer 220 may include one of Mg/MgO, MgO/Mg, or Mg/MgO/Mg. The tunnel barrier layer 220 may be formed of a material having a crystalline structure. For example, the tunnel barrier layer 220 may have Body Centered Cubic lattice structure.

Referring to FIG. 2B, the variable resistance pattern RE may include a first conductive magnetic layer 210 and a second conductive magnetic layer 230. The first and second conductive magnetic layers 210 and 230 may be spaced apart from each other, for example, in a vertical direction. The first conductive magnetic layer 210 may include a first pinning layer 216 and a first pinned layer 217. The first pinning layer 216 may include an anti-ferromagnetic material. For example, the first pinning layer 216 may include at least one material selected from the group consisting of PtMn, IrMn, MnO, MnS, MnTe, $MnF_2$, $FeCl_2$, FeO, $CoCl_2$, CoO, $NiCl_2$, NiO and/or Cr. The first pinned layer 217 may be configured to have a magnetization direction fixed by the first pinning layer 216. The first pinned layer 217 may include a ferromagnetic material. In some embodiments, the first pinned layer 217 may be a single-layered structure formed of ferromagnetic material. In other embodiments, the first pinned layer 217 may include at least one material selected from the group consisting of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO and/or $Y_3Fe_5O_{12}$.

The second conductive magnetic layer 230 may be configured to have the same technical features as those described with reference to FIG. 2A.

A third conductive magnetic layer 240 may be provided on the second conductive magnetic layer 230. The third conductive magnetic layer 240 may include a second pinned layer 243 and a second pinning layer 245. In some embodiments, the second pinned layer 243 and the second pinning layer 245 may be formed of the same materials as the first pinned layer 217 and the first pinning layer 216, respectively.

A first tunnel barrier layer 221 may be provided between the first conductive magnetic layer 210 and the second conductive magnetic layer 230, and a second tunnel barrier layer 225 may be provided between the second conductive magnetic layer 230 and the third conductive magnetic layer 240. The first and second tunnel barrier layers 221 and 225 may be configured to have the same technical features and the same material as the tunnel barrier layer 220 described with reference to FIG. 2A.

In these embodiments, the variable resistance pattern RE may have a dual MTJ structure including the first conductive magnetic layer 210, the second conductive magnetic layer 230, and the third conductive magnetic layer 240.

Example embodiments of inventive concepts may not be limited to the afore-described structures of the variable resistance pattern RE and may be modified variously.

According to the afore-described embodiments of inventive concepts, the semiconductor memory device may include the vertical transistor, whose source, channel, and drain regions are vertically stacked, and the variable resistance pattern RE vertically stacked on the vertical transistor. This vertical arrangement of elements of a unit memory cell may enable an increased density and/or capacity semiconductor memory device.

Furthermore, according to example embodiments of inventive concepts, the variable resistance pattern RE serving as an information storing element may be a two-terminal device (for example, MTJ), which can be manufactured using a simplified fabrication process. As a result, the semiconductor memory device according to example embodiments of inventive concepts may be fabricated with relative ease and/or simplicity.

Figure 3A:
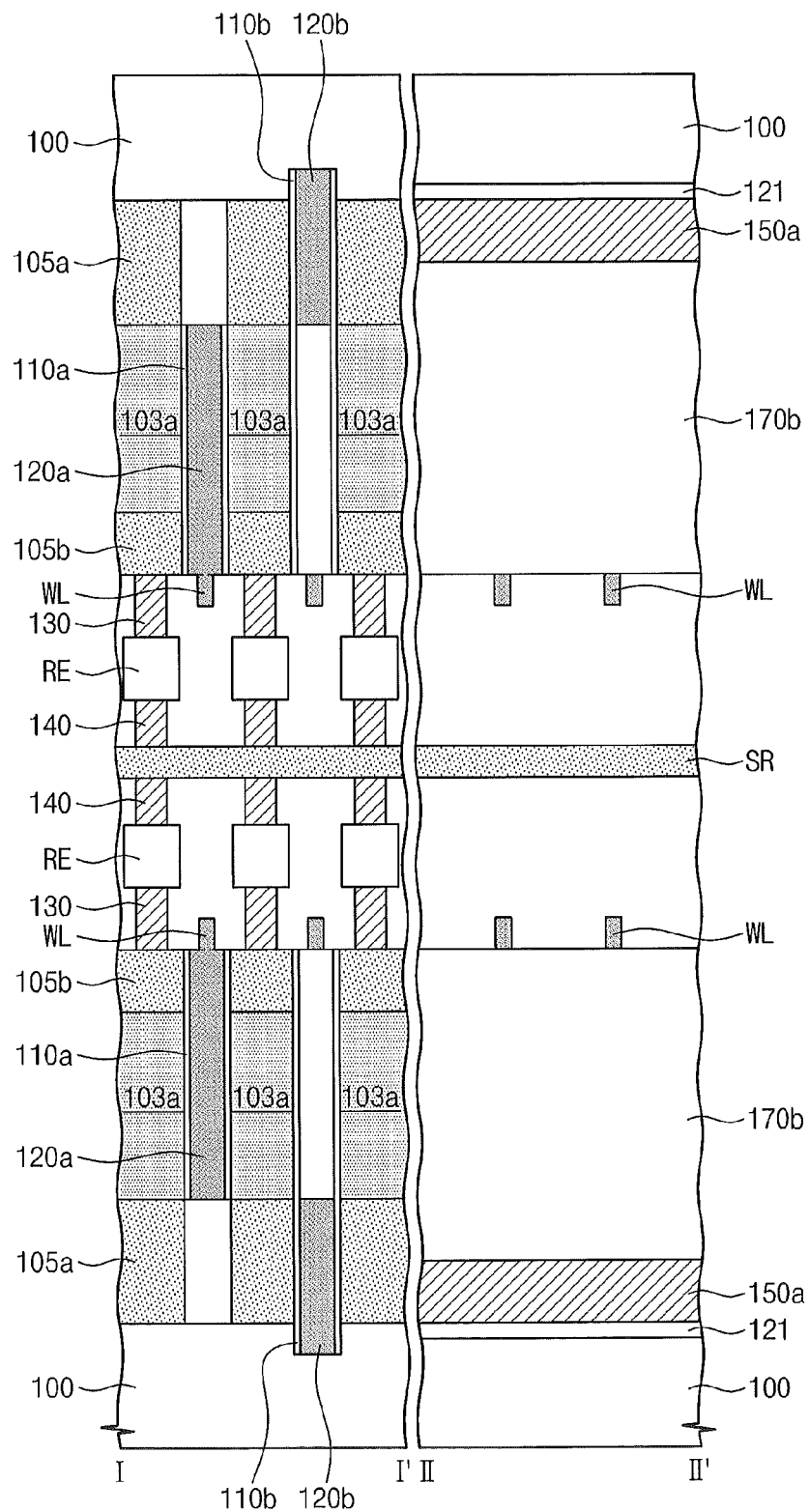
FIGS. 3A and 3B are sectional views illustrating some examples of a semiconductor memory device according to example embodiments of inventive concepts.
Figure 3B:
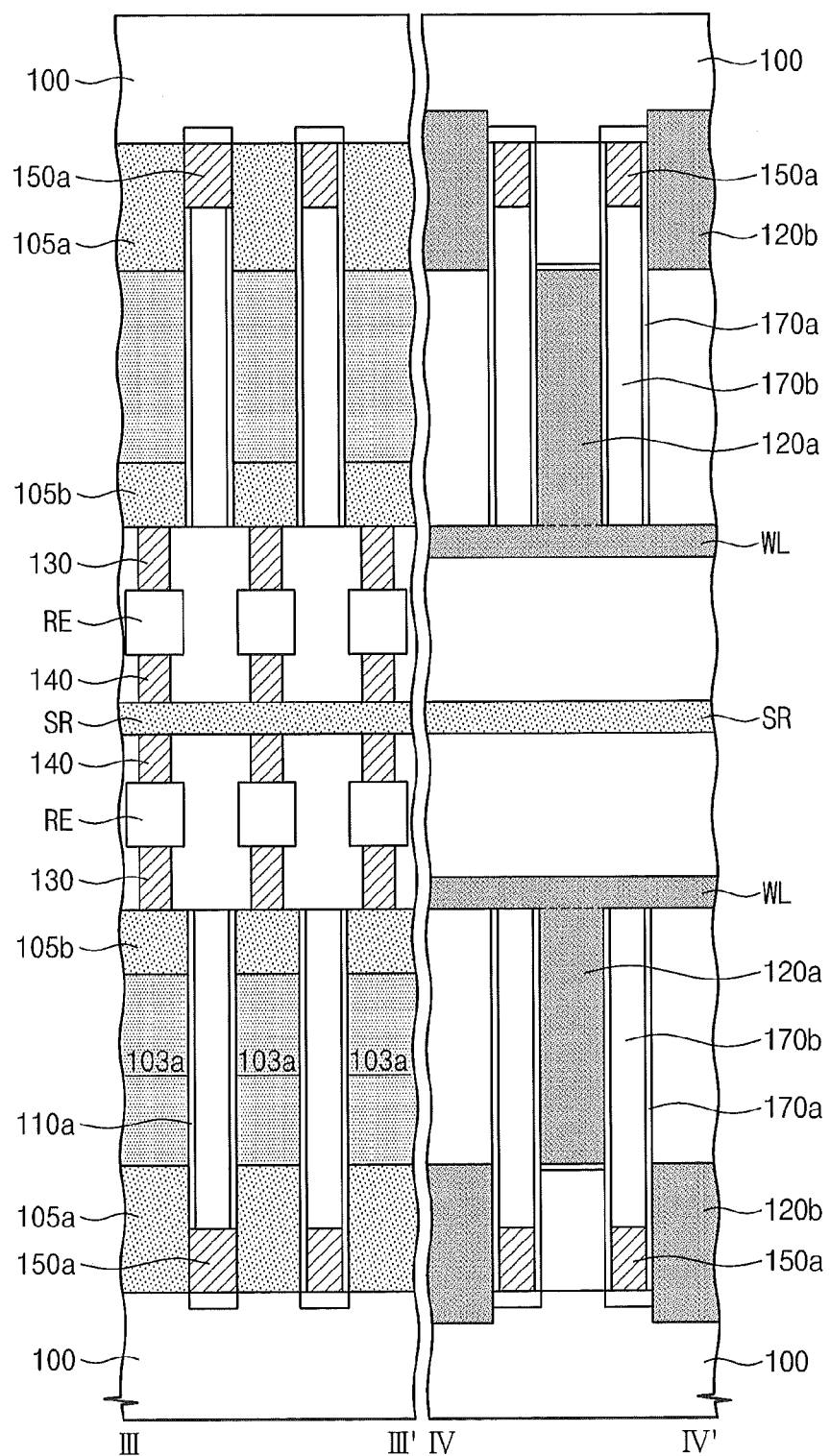

FIGS. 3A and 3B are sectional views illustrating some examples of a semiconductor memory device according to example embodiments of inventive concepts.

As shown in FIGS. 3A and 3B, a semiconductor memory device may include a first structure and a second structure, which are attached to each other using an intermediate layer interposed therebetween. In these examples, each of the first and second structures may be configured to have substantially the same structure as the semiconductor memory device described previously with reference to FIG. 1A. According to the present embodiments, the intermediate layer may be used as a common source region SR and may be shared by the first and second structures. To achieve this, the first and second structures may be disposed to have mirror symmetry with respect to the intermediate layer or the common source region SR. In some embodiments, a conductive adhesive may be used to attach the first and second structures to the intermediate layer (or the common source region SR).

According to present embodiments, memory elements (i.e., the variable resistance patterns RE) are three-dimensionally arranged. This may enable increased capacity and/or density memory devices and or systems.

Figure 4A:
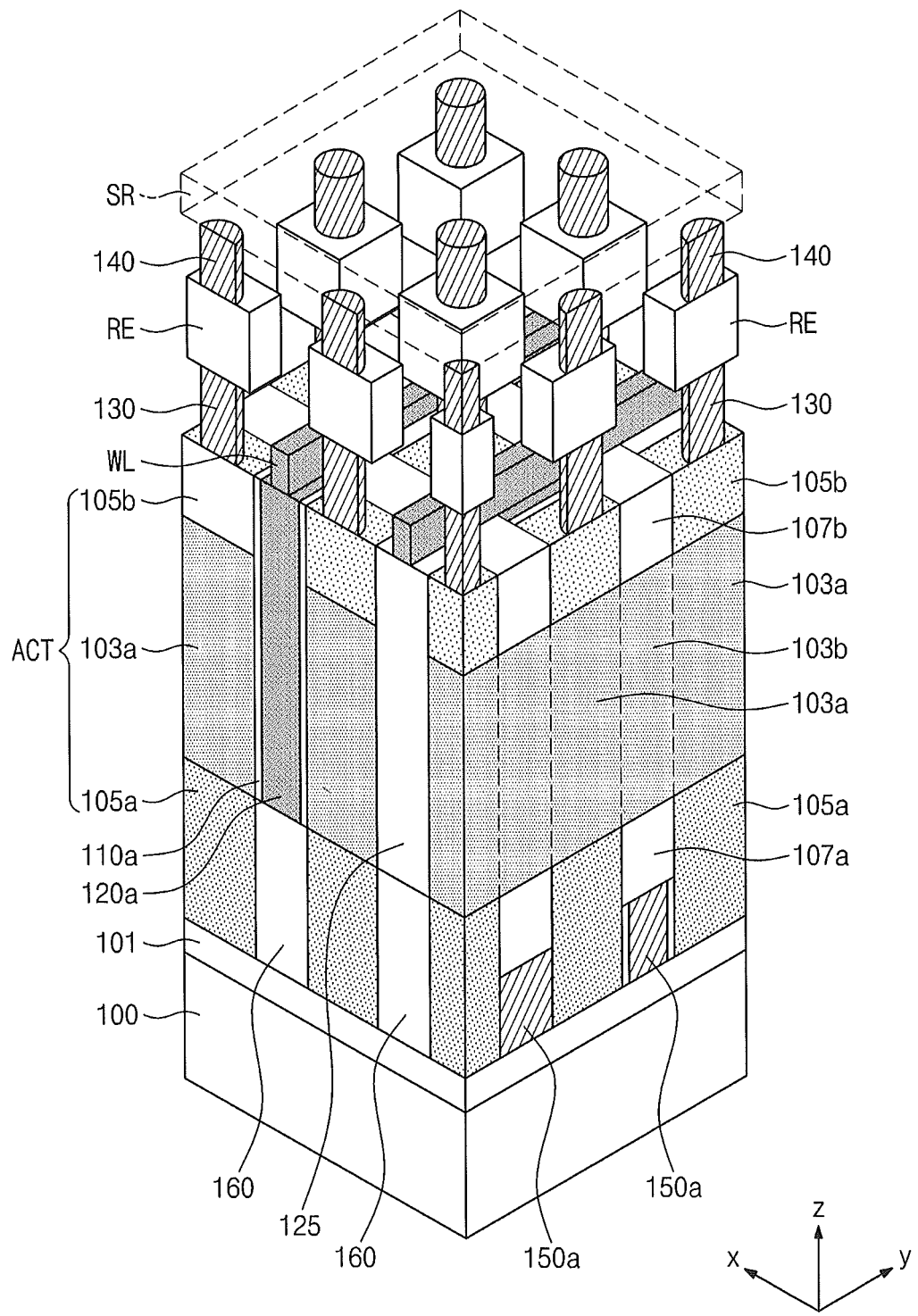
FIG. 4A is a perspective view of a semiconductor memory device according to other example embodiments of inventive concepts.
Figure 4B:
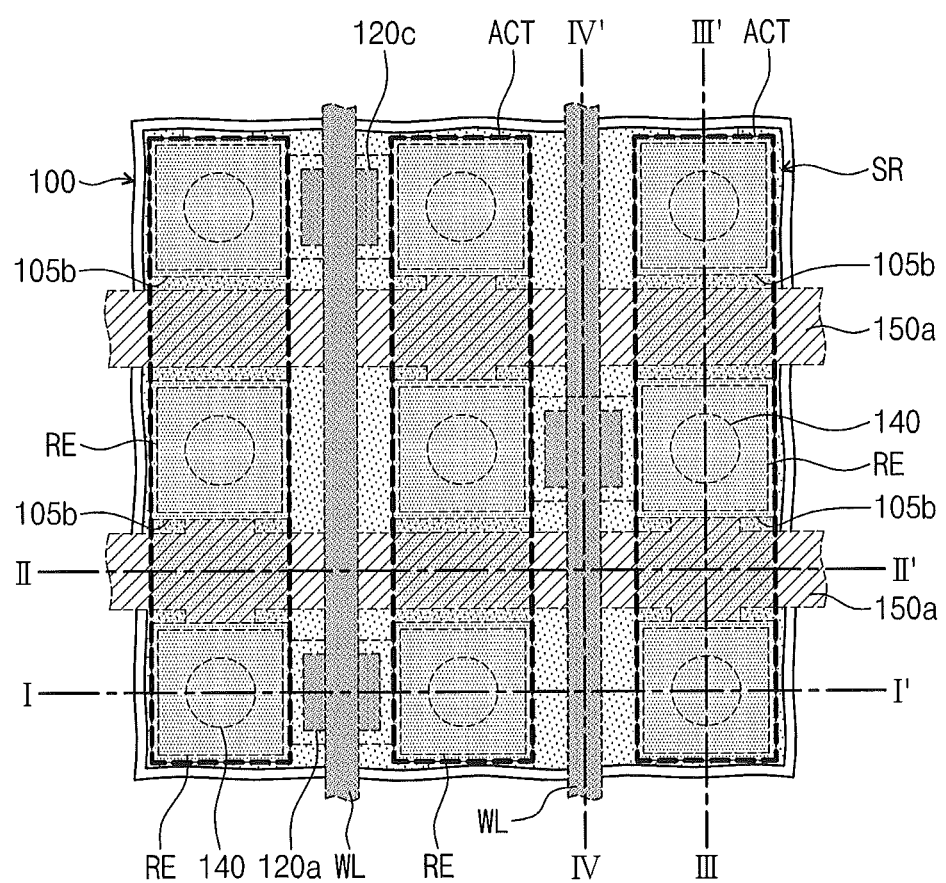
FIG. 4B is a plan view of a semiconductor memory device according to other example embodiments of inventive concepts.
Figure 4C:
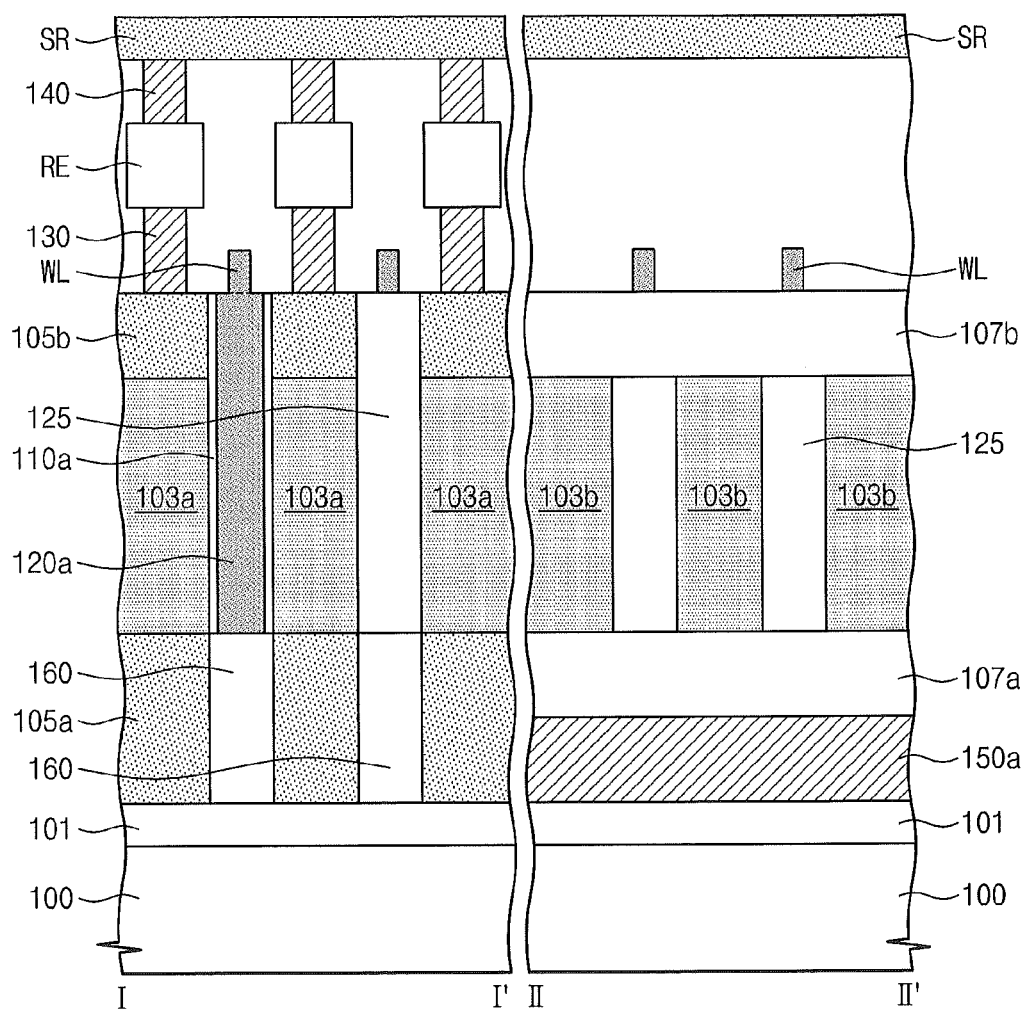
FIGS. 4C and 4D are sectional views taken along lines I-I', II-II', III-III', and IV-IV' of FIG. 4B.
Figure 4D:
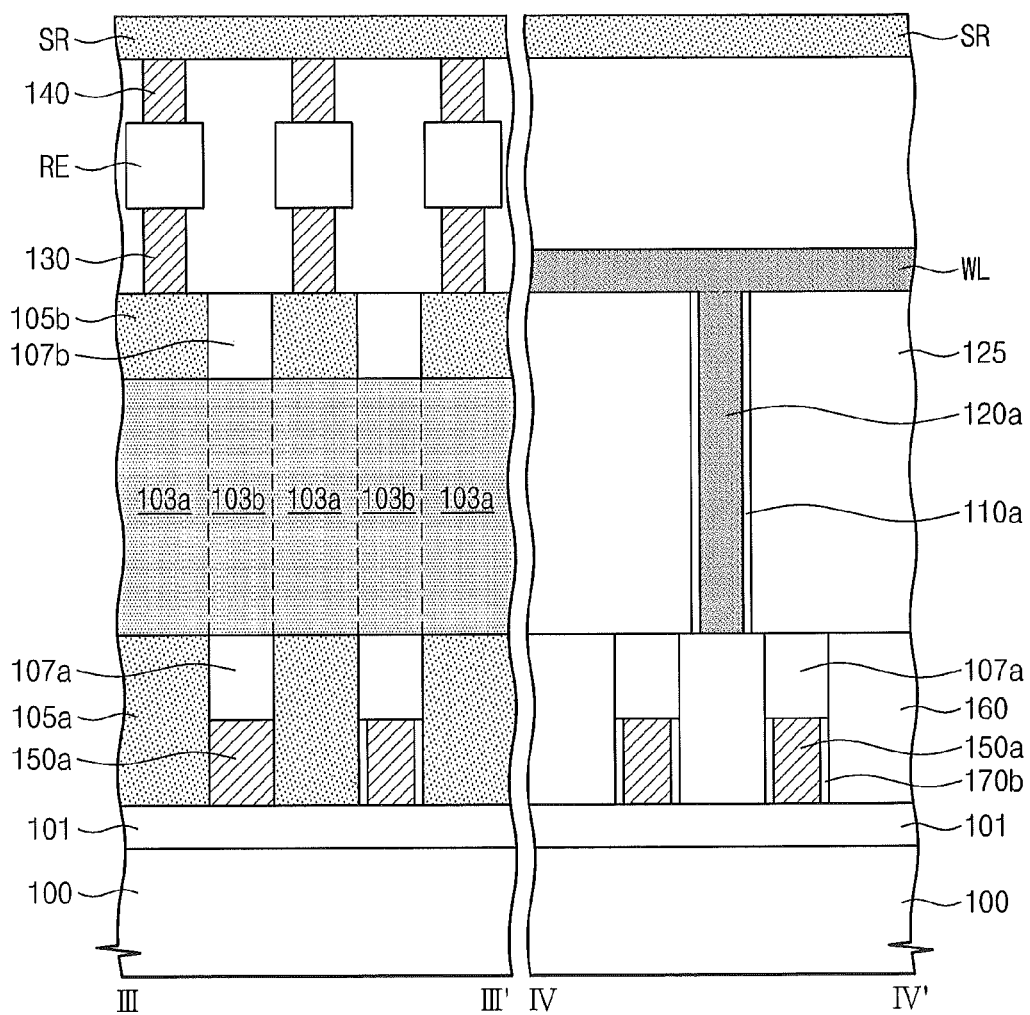

FIG. 4A is a perspective view of a semiconductor memory device according to other example embodiments of inventive concepts, FIG. 4B is a plan view of the semiconductor memory device according to other example embodiments of inventive concepts, and FIGS. 4C and 4D are sectional views taken along lines I-I', II-II', III-III', and IV-IV' of FIG. 4B. For the sake of brevity, elements and features of these embodiments that are similar to those previously shown and described may not be described further in full detail.

Referring to FIGS. 4A through 4D, a plurality of active patterns ACT may be provided on a substrate 100. The active patterns ACT may be formed to have a shape protruding upward from the substrate 100. In plan view, the active patterns ACT may be two-dimensionally arranged along rows and columns. In some embodiments, the rows and the columns may be parallel to a first direction (or x axis of FIG. 4A) and a second direction (or y axis of FIG. 4A), respectively.

Each of the active patterns ACT may include a first doped region 105a, a channel region 103a, and a second doped region 105b, which are vertically stacked on the substrate 100. In other words, the channel region 103a may be between the first and second doped regions 105a and 105b. The first and second doped regions 105a and 105b and the channel region 103a may be used as portions of a single vertical channel transistor. For example, the first and second doped regions 105a and 105b may serve as source/drain regions of the vertical channel transistor, and the channel region 103a may serve as a channel region of the vertical channel transistor.

Connecting portions 103b may be provided to connect the active patterns ACT, which are disposed along the second direction, with each other. In some embodiments, as shown in FIG. 4A, the connecting portions 103b may be configured to connect the channel regions 103a of the active patterns ACT arranged along the second direction. The connecting portions 103b may have the same conductivity type as the channel region 103a. For a conventional vertical channel transistor, the channel region 103a may be spaced apart from the substrate 100 due to the presence of the first doped region 105a interposed therebetween, and thus, an undesired floating body effect may occur in the vertical transistor. However, in present embodiments, due to the presence of the connecting portions 103b, it may be possible to reduce and/or prevent the occurrence of the floating body effect. That is, the channel regions 103a may not float because excess charges (e.g., holes) may be extracted from the channel regions 103a via the connecting portions 103b. This may enable a semiconductor memory device having increased reliability.

Gate patterns 120a may be provided between the active patterns ACT, and gate dielectric patterns 110a may be provided between the gate patterns 120a and the active adjacent patterns ACT. Each of the gate patterns 120a may be disposed to face a sidewall of each of the active patterns ACT. A plurality of word lines WL may be provided parallel to the second direction on the substrate 100. Each of the word lines WL may be connected to a plurality of the gate patterns 120a disposed thereunder.

First and second dielectric gap-filling patterns 160 and 125 may be provided between the first doped regions 105a of adjacent active patterns ACT disposed along the first direction. The second dielectric gap-filling patterns 125 may be disposed between the word lines WL and the first dielectric gap-filling patterns 160. Furthermore, the first dielectric gap-filling pattern 160 may be disposed between the gate patterns 120a and the substrate 100. Due to the presence of the first dielectric gap-filling patterns 160, the first doped regions 105a may be spaced apart from each other in the first direction. In some embodiments, the entire sidewall of the first doped region 105a may be covered with the first dielectric gap-filling pattern 160. The first and second dielectric gap-filling patterns 160 and 125 may include at least one of oxide, nitride, and/or oxynitride.

A buried dielectric 101 may be provided between the substrate 100 and the active patterns ACT. The buried dielectric 101 may include at least one of oxide, nitride, and/or oxynitride. In some embodiments, the buried dielectric 101 may include an adhesive material, which is used to attach the active patterns ACT onto the substrate 100. In this case, the active patterns ACT may be independently manufactured on or from a semiconductor substrate different from the substrate 100.

A plurality of interconnection lines 150a may be provided parallel to each other on the substrate 100 to cross the word lines WL. Each of the interconnection lines 150a may be disposed between the active patterns ACT and may be parallel to the first direction. In other words, there may be a plurality of active patterns ACT, arranged along the first direction, between a pair of the interconnection lines 150a disposed adjacent to each other.

Dielectric patterns 107a may be provided between the interconnection lines 150a and the second dielectric gap-filling pattern 125 and between the interconnection lines 150a and the connecting portions 103b. The dielectric patterns 107a may extend, for example, parallel to the interconnection lines 150a. The dielectric patterns 107a may include at least one of oxide, nitride, and/or oxynitride.

Dielectric patterns 107b may be provided between the second doped regions 105b. Each of the dielectric patterns 107b may be formed to have a line shape extending parallel to the interconnection lines 150a. The dielectric patterns 107b may include at least one of oxide, nitride, and/or oxynitride.

The afore-described technical effects may also be achieved from the semiconductor memory device according to present embodiments.

Furthermore, according to present embodiments, since the channel regions 103a of the active patterns ACT are connected with each other by the connecting portions 103b, it may be possible to effectively reduce and/or prevent occurrence of the floating body effect. This may enable a semiconductor memory device having a simplified structure and/or exhibiting improved reliability and electrical properties.

Figure 5A:
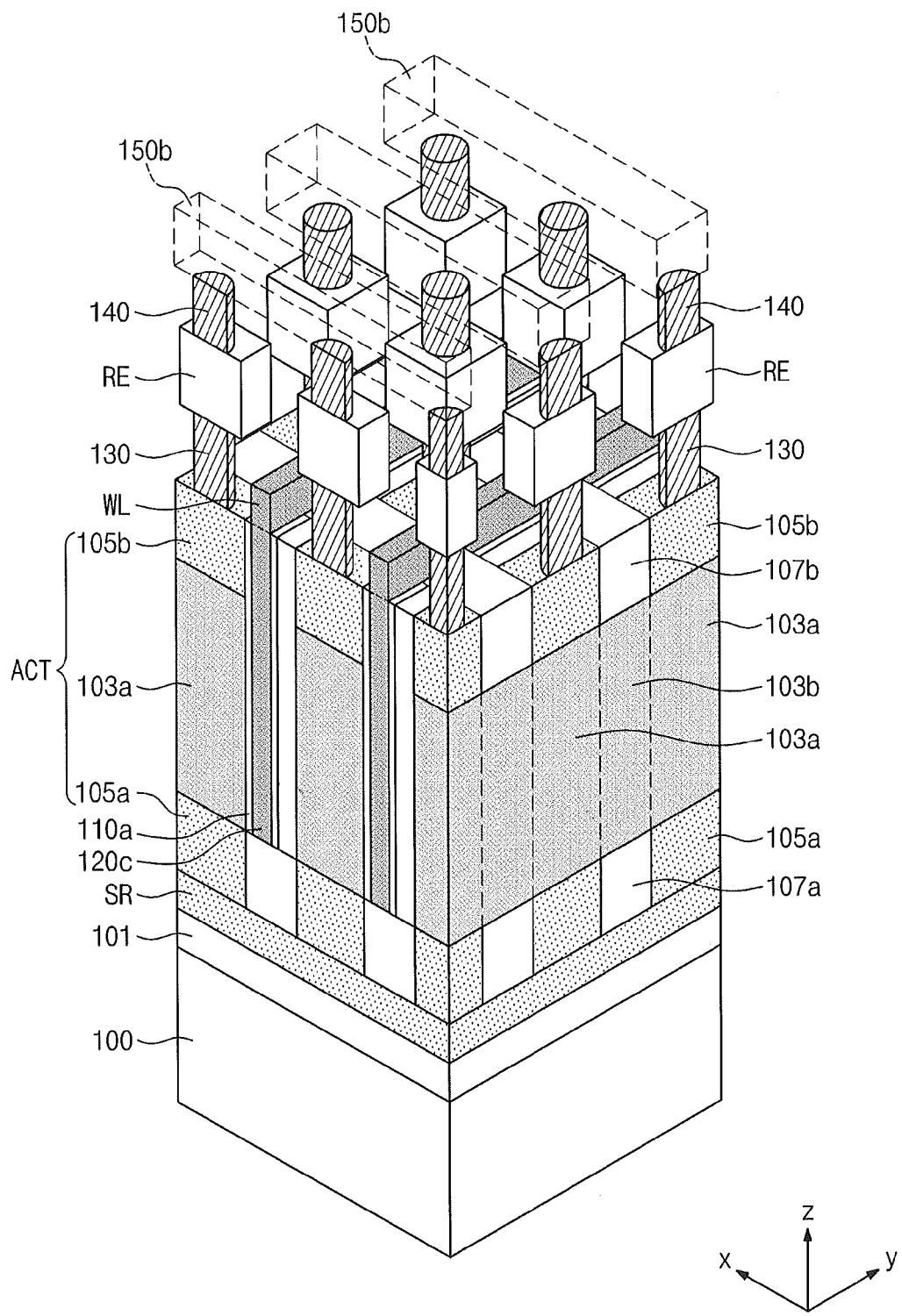
FIG. 5A is a perspective view of a semiconductor memory device according to still other example embodiments of inventive concepts.
Figure 5B:
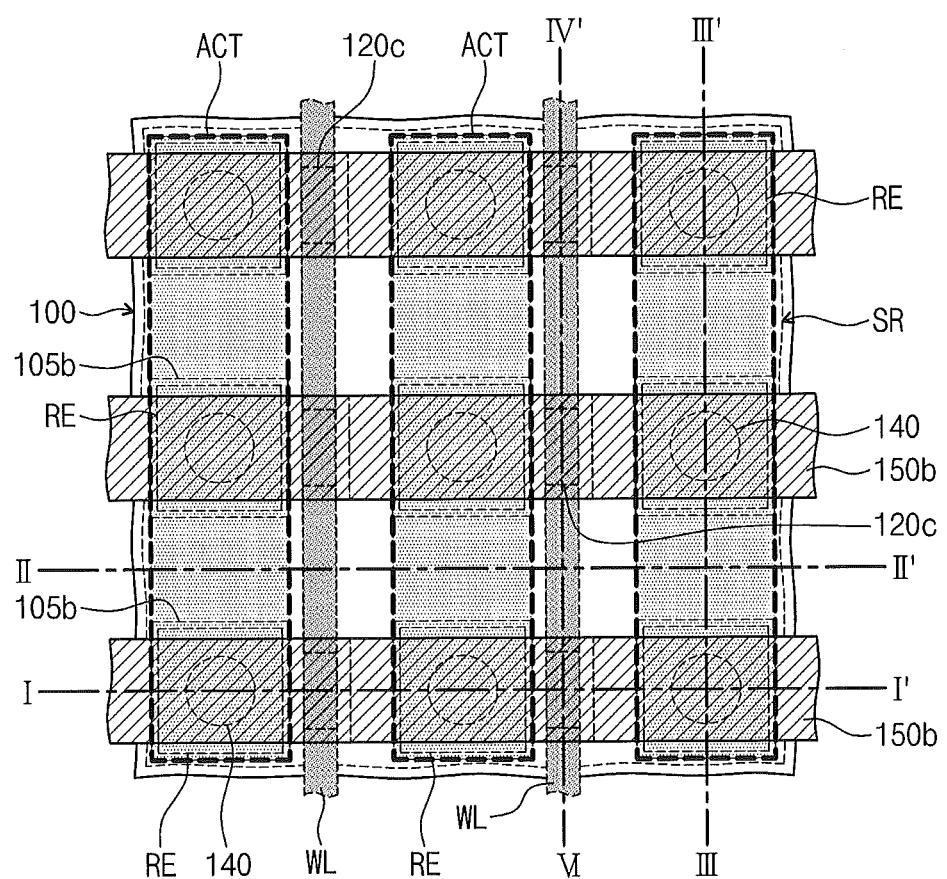
FIG. 5B is a plan view of a semiconductor memory device according to other example embodiments of inventive concepts.
Figure 5C:
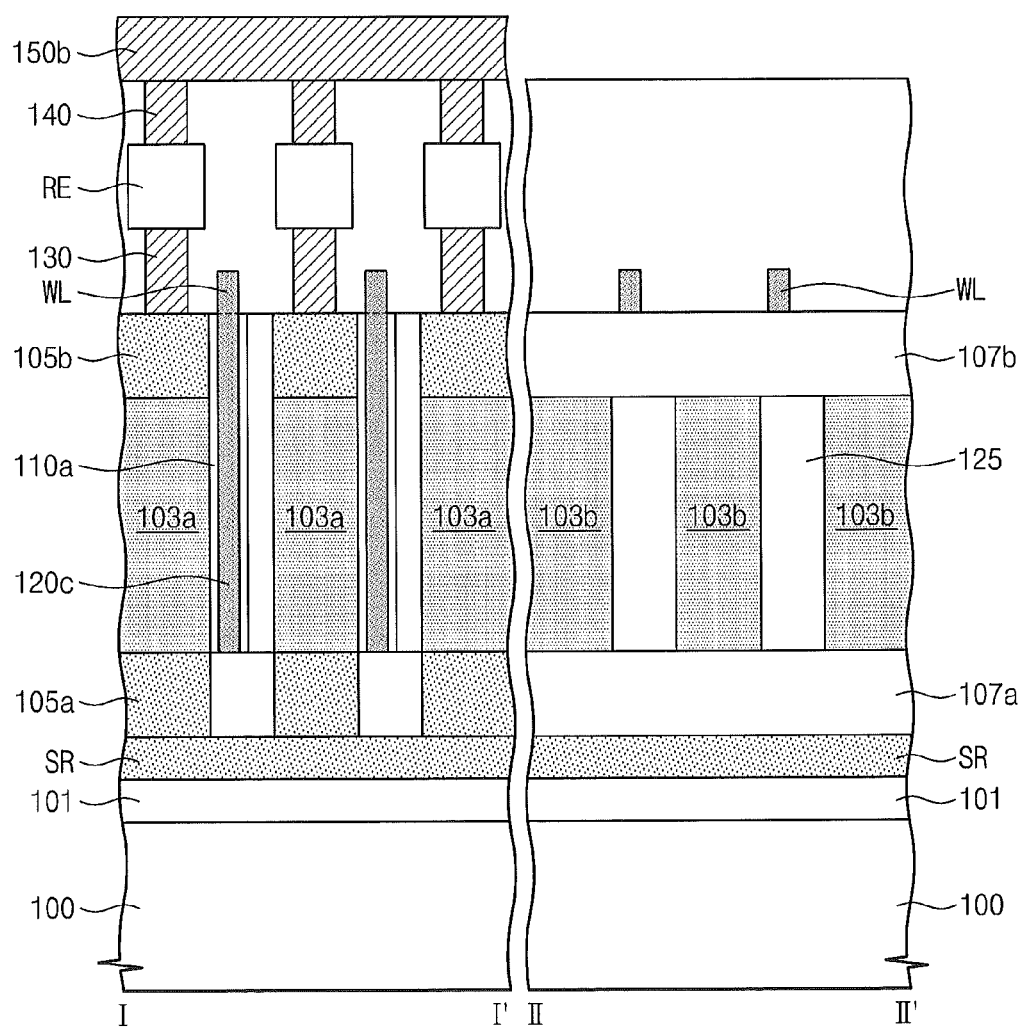
FIGS. 5C and 5D are sectional views taken along lines I-I', II-II', III-III', and IV-IV' of FIG. 5B.
Figure 5D:
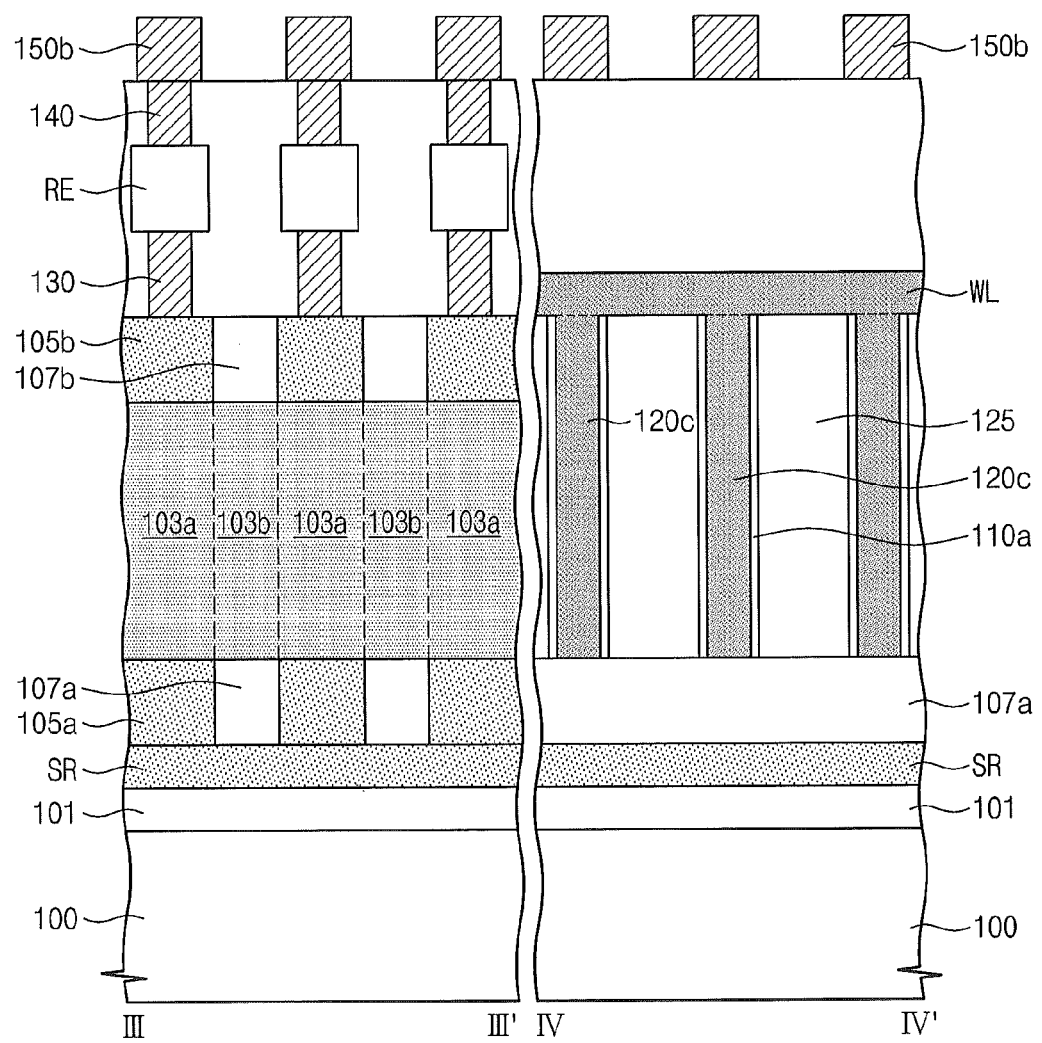

FIG. 5A is a perspective view of a semiconductor memory device according to still other example embodiments of inventive concepts, FIG. 5B is a plan view of the semiconductor memory device of FIG. 5A, and FIGS. 5C and 5D are sectional views taken along lines I-I', II-II', III-III', and IV-IV' of FIG. 5B. For the sake of brevity, the elements and features of these embodiments that are similar to those previously shown and described may not be described further in full detail.

Referring to FIGS. 5A through 5D, a plurality of active patterns ACT may be provided on a substrate 100. The active patterns ACT may be formed to have a shape protruding upward from the substrate 100. In plan view, the active patterns ACT may be two-dimensionally arranged along rows and columns. In some embodiments, the rows and the columns may be parallel to a first direction (or x axis of FIG. 5A) and a second direction (or y axis of FIG. 5A), respectively.

Each of the active patterns ACT may include a first doped region 105a, a channel region 103a, and a second doped region 105b, which are vertically stacked on the substrate 100. In other words, the channel region 103a may be interposed between the first and second doped regions 105a and 105b. The first and second doped regions 105a and 105b and the channel region 103a may be used as portions of a single vertical channel transistor. For example, the first and second doped regions 105a and 105b may serve as source/drain regions of the vertical channel transistor, and the channel region 103a may serve as a channel region of the vertical channel transistor.

Connecting portions 103b may be provided to connect the active patterns ACT, which are disposed along the second direction, with each other. In some embodiments, as shown in FIG. 5A, the connecting portions 103b may be configured to connect the channel regions 103a of the active patterns ACT arranged along the second direction. As a result, the technical effects described previously with reference to FIGS. 4A and 4B may be achieved from the semiconductor memory device according to present embodiments.

A buried dielectric 101 may be provided between the substrate 100 and the active patterns ACT, and a common source region SR may be provided between the buried dielectric 101 and the active patterns ACT. The common source region SR may be connected in common to the first doped regions 105a of the active patterns ACT. The common source region SR may enable reduced electric resistance of an electric pathway between the first doped region 105a and an external voltage source. This may enable increased a high-density semiconductor memory devices.

A plurality of word lines WL extending along the second direction may be disposed on the substrate 100. The word lines WL may include at least one material selected from the group consisting of a doped semiconductor (e.g., doped silicon, doped germanium, doped silicon-germanium, etc.), a conductive metal nitride (e.g., titanium nitride, tantalum nitride, etc.), a transition metal (e.g., titanium, tantalum, etc.), or a metal (e.g., tungsten), but example embodiments of inventive concepts may not be limited thereto.

Gate patterns 120c may be two-dimensionally provided on the substrate 100. Each of the word lines WL may connect a plurality of the gate patterns 120c disposed thereunder with each other. Each of the gate patterns 120c may be disposed between a pair of the active patterns ACT disposed adjacent to each other in the first direction, and each of the active patterns ACT may be disposed between a pair of the gate patterns 120c disposed adjacent to each other in the first direction.

Each of the active patterns ACT may be disposed to face a sidewall of a corresponding one of the gate patterns 120c. Dielectric gap-filling patterns 125 may be provided under the word lines WL. The dielectric gap-filling patterns 125 may be disposed between the gate patterns 120c arranged along the second direction. In other words, each of the gate patterns 120c may be interposed between the active patterns ACT in the first direction and between the dielectric gap-filling patterns 125 in the second direction.

Each of the gate patterns 120c may have a plug or pillar shape, and a bottom surface of each of the gate patterns 120c may be located at a level equivalent to or lower than a top surface of the first doped region 105a. The bottom surface of each of the gate patterns 120c may be located at a level higher than a bottom surface of the first doped region 105a.

According to present embodiments, the first and second doped regions 105a and 105b and the channel region 103a may be used as portions of a single vertical channel transistor, and each of the gate patterns 120c may be used to control a corresponding one of the vertical channel transistors.

The gate patterns 120c may include at least one material selected from the group consisting of a doped semiconductor (e.g., doped silicon, doped germanium, doped silicon-germanium, etc.), a conductive metal nitride (e.g., titanium nitride, tantalum nitride, etc.), a transition metal (e.g., titanium, tantalum, etc.), or a metal (e.g., tungsten), but example embodiments of inventive concepts may not be limited thereto.

Lower dielectric patterns 107a may be provided between the gate patterns 120c and the common source region SR. The lower dielectric patterns 107a may be disposed between the first doped regions 105a of the active patterns ACT. The lower dielectric patterns 107a may include at least one of oxide, nitride, and/or oxynitride.

Upper dielectric patterns 107b may be provided between the active patterns ACT or between the second doped regions 105b. Each of the upper dielectric patterns 107b may be formed to have a line shape crossing the word lines WL. The upper dielectric patterns 107b may include at least one of oxide, nitride, and/or oxynitride.

Variable resistance patterns RE may be provided on the active patterns ACT, respectively. Each of the variable resistance patterns RE may be connected to the corresponding one of the second doped regions 105b. Unlike shown in the drawings, the variable resistance pattern RE may be shaped like a line or a plate. In this case, a plurality of the second doped regions 105b may be connected in common to the variable resistance pattern RE provided as a single body.

First contact plugs 130 may be provided between the variable resistance patterns RE and the second doped regions 105b, respectively.

Interconnection lines 150b may be provided on the variable resistance patterns RE. The interconnection lines 150b may be disposed to cross the word lines WL, in plan view. The interconnection lines 150b may be connected to the variable resistance patterns RE. In some embodiments, each of the interconnection lines 150b may connect the variable resistance patterns RE, which are arranged along the first direction, but example embodiments of inventive concepts may not be limited thereto. In the case in which the variable resistance pattern RE is shaped like a line or a plate, a plurality of the interconnection lines 150b may be connected in common to the variable resistance pattern RE provided as a single body.

The interconnection line 150b may include at least one material selected from the group consisting of a metal (e.g., tungsten), a conductive metal nitride (e.g., titanium nitride, tantalum nitride, etc.), or a transition metal (e.g., titanium, tantalum, etc.), but example embodiments of invention concepts may not be limited thereto.

In some embodiments, second contact plugs 140 may be provided between the variable resistance patterns RE and the interconnection lines 150b.

The afore-described technical effects may also be achieved from semiconductor memory devices according to present embodiments.

Furthermore, according to present embodiments, the interconnection lines 150b are disposed on the active patterns ACT. This may enable forming the interconnection lines 150b with a metallic material of low resistance and/or simplifying a structure or fabricating process of the semiconductor memory device. In addition, it may be possible to reduce electrical disturbance between the interconnection lines 150b and/or between the interconnection lines 150b and the gate patterns 120c. Accordingly, it may be possible to realize a semiconductor memory device with increased reliability.

Figure 6:
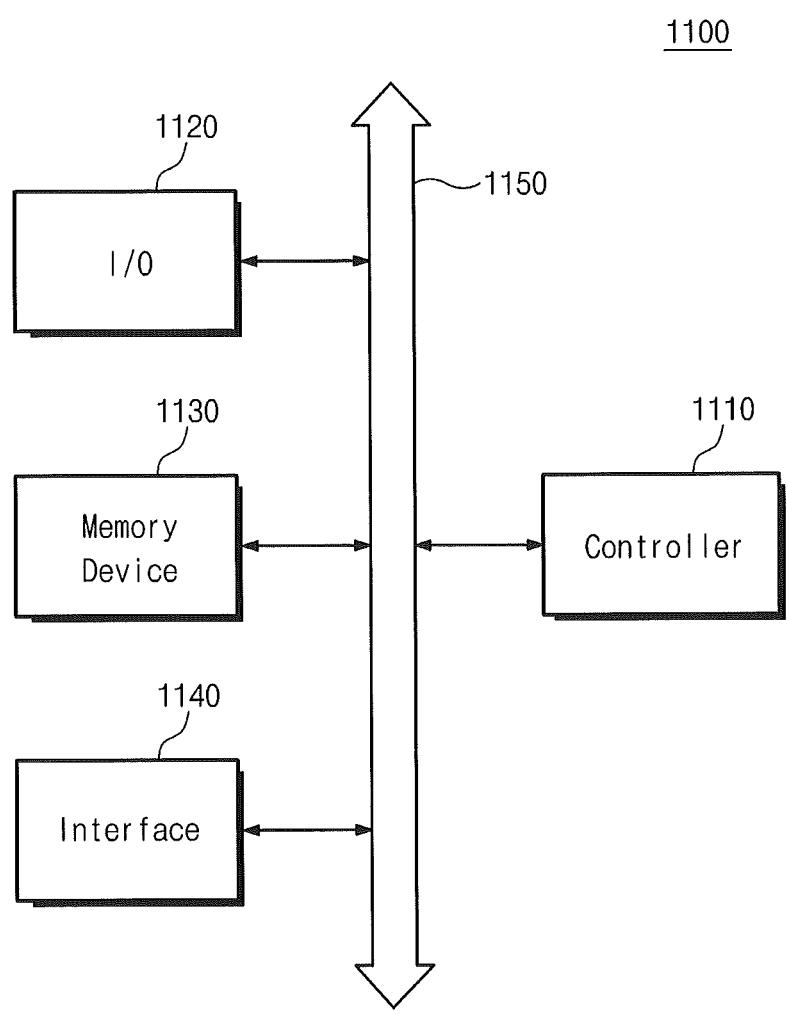
FIG. 6 is a schematic block diagram illustrating an example of memory systems including at least one semiconductor memory device according to the afore-described example embodiments of inventive concepts.

FIG. 6 is a schematic block diagram illustrating an example of memory systems including at least one of the semiconductor memory devices according to the afore-described example embodiments of inventive concepts.

Referring to FIG. 6, a memory system 1100 according to example embodiments of inventive concepts may include a controller 1110, an input/output (I/O) unit 1120, a memory device 1130, an interface unit 1140 and a data bus 1150. At least two of the controller 1110, the I/O unit 1120, the memory device 1130, and/or the interface unit 1140 may communicate with each other through the data bus 1150. The data bus 1150 may provide to a path through which electrical signals are transmitted.

The controller 1110 may include at least one of a microprocessor, a digital signal processor, a microcontroller or other logic devices. The other logic devices may have a similar function to any one of the microprocessor, the digital signal processor, and the microcontroller. The I/O unit 1120 may include a keypad, a keyboard, and/or a display unit. The memory device 1130 may store data and/or commands. The memory device 1130 may include at least one of the semiconductor memory devices according to embodiments described above. The memory device 1130 may further include other types of semiconductor memory devices which are different from semiconductor memory devices described above. For example, the memory device 1130 may further include a magnetic memory device, a phase change memory device, a dynamic random access memory (DRAM) device and/or a static random access memory (SRAM) device. The interface unit 1140 may transmit electrical data to a communication network and/or may receive electrical data from a communication network. The interface unit 1140 may operate using wireless or cable. For example, the interface unit 1140 may include an antenna for wireless communication and/or a transceiver for cable communication. Although not shown in the drawings, the electronic system 1100 may further include a fast DRAM device and/or a fast SRAM device that acts as a cache memory to improve operation of the controller 1110.

The electronic system 1100 may be applied to a personal digital assistant (PDA), a portable computer, a web tablet, a wireless phone, a mobile phone, a digital music player, a memory card, or other electronic product. The electronic product may receive or transmit information data by wireless.

Figure 7:
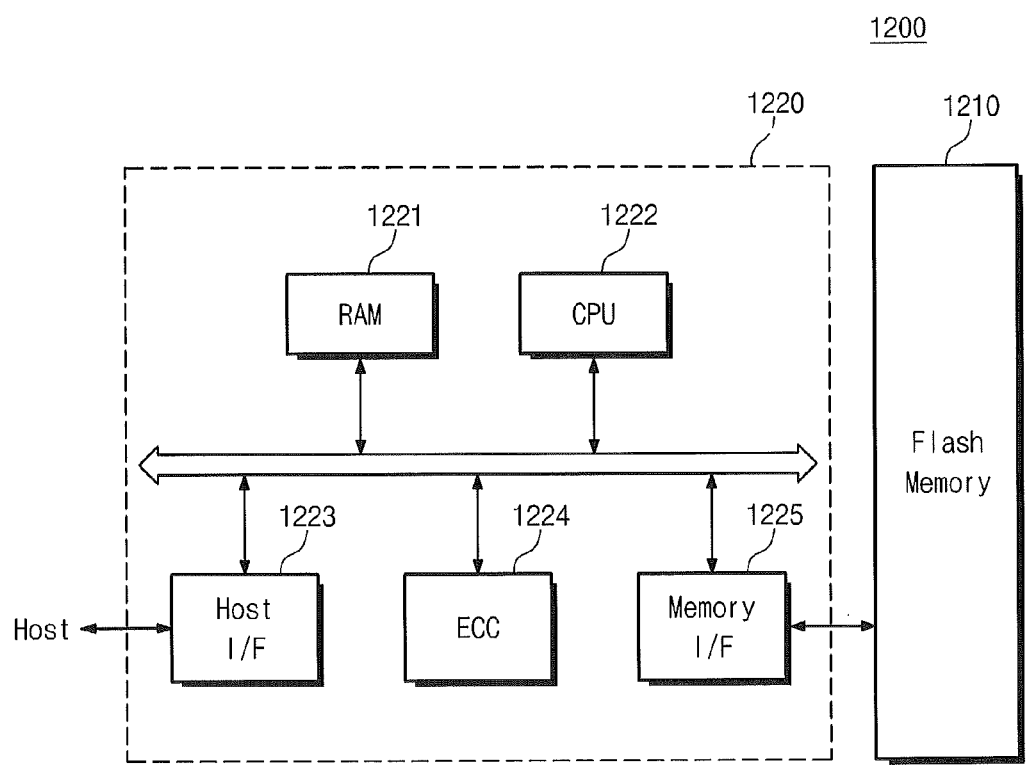
FIG. 7 is a schematic block diagram illustrating an example of memory cards including at least one semiconductor memory device according to the afore-described example embodiments of inventive concepts.

FIG. 7 is a schematic block diagram illustrating an example of memory cards including at least one of the semiconductor memory devices according to the afore-described example embodiments of inventive concepts.

Referring to FIG. 7, a memory card 1200 according to embodiments of inventive concepts may include a memory device 1210. The memory device 1210 may include at least one of the semiconductor memory devices according to the various embodiments mentioned above. In other embodiments, the memory device 1210 may further include another type of semiconductor memory device which is different from the semiconductor memory devices according to the embodiments described above. For example, the memory device 1210 may further include a nonvolatile memory device and/or a static random access memory (SRAM) device. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to support a data communication protocol for communication between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may replace hard disks of computer systems as solid state disks (SSD) of the computer systems.

The semiconductor memory devices disclosed above may be encapsulated using various and diverse packaging techniques. For example, semiconductor memory devices according to the aforementioned embodiments may be encapsulated using any one of a package on package (POP) technique, a ball grid array (BGA) technique, a chip scale package (CSP) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, and/or a wafer-level processed stack package (WSP) technique.

The package in which the semiconductor memory device according to one of the above embodiments is mounted may further include at least one semiconductor device (e.g., a controller and/or a logic device) that controls the semiconductor memory device.

According to the afore-described example embodiments of inventive concepts, the semiconductor memory device may include an active pattern, a variable resistance pattern and a common source region, and the active pattern may include a pair of vertically stacked doped regions and a channel region interposed therebetween that are used as parts of a vertical channel transistor. As a result, the vertical channel transistor can be fabricated to have a reduced planar area. In addition, the variable resistance pattern is vertically stacked on the active pattern. This may enable realization of high-density semiconductor memory devices.

The common source region may be connected to the doped region of the active pattern. This may enable reduced electric resistance of an electric pathway between the first doped region 105*a* and an external voltage source. As a result, it may be possible to realize semiconductor memory devices having increased density.

In addition, the variable resistance pattern serving as an information storing element may be a two-terminal device (for example, MTJ), which may be manufactured using a simplified fabrication process. As a result, semiconductor memory devices according to example embodiments of inventive concepts may be fabricated with relative ease and/or simplicity.

While example embodiments of inventive concepts have been particularly shown and described, it will be understood by one of ordinary skill in the art that variations in form and detail may be made therein without departing from the spirit and scope of the attached claims.

What is claimed is:
1. A semiconductor memory device comprising:
   a substrate;
   a transistor structure on the substrate wherein the transistor structure includes first and second doped semiconductor regions and a semiconductor channel region between the first and second doped semiconductor regions with the first doped semiconductor region, the semiconductor channel region, and the second doped semiconductor region being aligned in a direction normal to a surface of the substrate and with the first doped semiconductor region being between the second doped semiconductor region and the substrate;
   a gate on a sidewall of the transistor structure adjacent the semiconductor channel region;
   a gate dielectric between the gate and the transistor structure;
   a variable resistance memory element electrically coupled to the second doped semiconductor region of the transistor structure with the transistor structure being between the variable resistance memory element and the substrate;
   an interconnection line electrically coupled to the first doped semiconductor region and extending in a direction parallel to the surface of the substrate; and a source electrically coupled to the variable resistance memory element with the transistor structure and the variable resistance memory element being between the source and the substrate.

2. The semiconductor memory device of claim 1 wherein the gate is on a first sidewall of the transistor structure, the device further comprising:
a conductive structure on a second sidewall of the transistor structure different than the first sidewall wherein the conductive structure is adjacent the first doped semiconductor region of the transistor structure; and
a dielectric layer between the conductive structure and the transistor structure.

3. The semiconductor memory device of claim 2 wherein the conductive structure is electrically coupled to the substrate.

4. The semiconductor memory device of claim 1 wherein the variable resistance memory element comprises a magnetic tunnel junction memory element.

5. The semiconductor memory device of claim 1 wherein the interconnection line extends in a first direction parallel with respect to the surface of the substrate, the device further comprising:
a word line electrically connected to the gate, wherein the word line extends in a second direction parallel with respect to the surface of the substrate wherein the first and second directions are orthogonal.

6. The semiconductor memory device of claim 5 wherein the transistor structure comprises a first transistor structure and the gate dielectric comprises a first gate dielectric, the device further comprising:
a second transistor structure on the substrate and spaced apart from the first transistor structure, wherein the second transistor structure includes first and second doped semiconductor regions and a semiconductor channel region between the first and second doped semiconductor regions with the first doped semiconductor region, the semiconductor channel region, and the second doped semiconductor region being aligned in a direction normal to a surface of the substrate and with the first doped semiconductor region being between the second doped semiconductor region and the substrate, wherein the gate is between the semiconductor channel regions of the first and second transistor structures, and wherein the first and second transistor structures are aligned in the first direction parallel with the interconnection line;
a second gate dielectric between the gate and the second transistor structure; and
a second variable resistance memory element electrically coupled to the second doped semiconductor region of the second transistor structure with the second transistor structure being between the second variable resistance memory element and the substrate, wherein the source is electrically coupled to the second variable resistance memory element with the second transistor structure and the second variable resistance memory element being between the source and the substrate.

7. The semiconductor device of claim 6 wherein the interconnection line comprises a first interconnection line, the device further comprising:
a second interconnection line electrically coupled to the first doped semiconductor region of the second transistor structure and extending in the direction parallel to the first interconnection line, wherein portions of the first and second transistor structures are between the first and second interconnection lines, wherein the first interconnection line is electrically isolated from the second transistor structure, and wherein the second interconnection line is electrically isolated from the first transistor structure.

8. The semiconductor device of claim 5 wherein the transistor structure comprises a first transistor structure, the gate comprises a first gate, the gate dielectric comprises a first gate dielectric, and the word line comprises a first word line, the device further comprising:
a second transistor structure on the substrate and spaced apart from the first transistor structure, wherein the second transistor structure includes first and second doped semiconductor regions and a semiconductor channel region between the first and second doped semiconductor regions with the first doped semiconductor region, the semiconductor channel region, and the second doped semiconductor region being aligned in a direction normal to a surface of the substrate and with the first doped semiconductor region being between the second doped semiconductor region and the substrate, wherein the first and second transistor structures are aligned in the second direction parallel with the first word line, and wherein the first doped semiconductor regions of the first and second transistor structures are electrically connected to the interconnection line;
a second gate on a sidewall of the second transistor structure adjacent the semiconductor channel region of the second transistor structure;
a second gate dielectric between the second gate and the second transistor structure; and
a second variable resistance memory element electrically coupled to the second doped semiconductor region of the second transistor structure with the second transistor structure being between the second variable resistance memory element and the substrate, wherein the source is electrically coupled to the second variable resistance memory element with the second transistor structure and the second variable resistance memory element being between the source and the substrate.

9. The semiconductor device of claim 8 further comprising:
a connecting portion connecting the semiconductor channel regions of the first and second transistor structures.

10. The semiconductor device of claim 8 further comprising:
a dielectric layer between the substrate and each of the first and second transistor structures.

11. A semiconductor memory device comprising:
a substrate;
a common source region on the substrate;
first and second transistor structures spaced apart on the substrate wherein each of the first and second transistor structures includes first and second doped semiconductor regions and a semiconductor channel region between the first and second doped semiconductor regions with the first doped semiconductor region, the semiconductor channel region, and the second doped semiconductor region being aligned in a direction normal to a surface of the substrate and with the first doped semiconductor region being between the second doped semiconductor region and the substrate, wherein the first doped semiconductor regions of the first and second transistor structures are electrically coupled to the common source region;
a first gate on a sidewall of the first transistor structure adjacent the semiconductor channel region of the first transistor structure;

a second gate on a sidewall of the second transistor structure adjacent the semiconductor channel region of the second transistor structure;
a first variable resistance memory element electrically coupled to the second doped semiconductor region of the first transistor structure with the first transistor structure being between the first variable resistance memory element and the substrate;
a second variable resistance memory element electrically coupled to the second doped semiconductor region of the second transistor structure with the second transistor being between the first variable resistance memory element and the substrate; and
a connecting portion connecting the semiconductor channel regions of the first and second transistor structures.

12. The semiconductor memory device of claim 11 further comprising:
a first word line coupled to the first gate; and
a second word line coupled to the second gate wherein the first and second word lines are spaced apart, wherein the first and second word lines are aligned in parallel with a direction of the connecting portion between the semiconductor channel regions.

13. The semiconductor memory device of claim 11 further comprising:
a first gate dielectric between the first gate and the first transistor structure; and
a second gate dielectric between the second gate and the second transistor structure.

14. The semiconductor memory device of claim 11 further comprising:
a gap-fill dielectric between the substrate and the common source region.

15. The semiconductor memory device of claim 11 further comprising:
a first interconnection line wherein the first variable resistance memory element and the first transistor are electrically coupled in series between the first interconnection line and the common source region; and
a second interconnection line wherein the second variable resistance memory element and the second transistor are electrically coupled in series between the second interconnection line and the common source region.

16. A semiconductor memory device comprising:
a substrate;
first and second transistor structures spaced apart on the substrate wherein each of the first and second transistor structures includes first and second doped semiconductor regions and a semiconductor channel region between the first and second doped semiconductor regions with the first doped semiconductor region, the semiconductor channel region, and the second doped semiconductor region being aligned in a direction normal to a surface of the substrate and with the first doped semiconductor region being between the second doped semiconductor region and the substrate;
a first gate on a sidewall of the first transistor structure adjacent the semiconductor channel region of the first transistor structure;
a second gate on a sidewall of the second transistor structure adjacent the semiconductor channel region of the second transistor structure;
a first variable resistance memory element electrically coupled to the second doped semiconductor region of the first transistor structure with the first transistor structure being between the first variable resistance memory element and the substrate;
a second variable resistance memory element electrically coupled to the second doped semiconductor region of the second transistor structure with the second transistor structure being between the first variable resistance memory element and the substrate;
a first word line coupled to the first gate;
a second word line coupled to the second gate wherein the first and second word lines are parallel; and
a connecting portion connecting the semiconductor channel regions of the first and second transistor structures in a direction parallel with the first and second word lines, wherein the semiconductor channel regions of the first and second transistor structures and the connecting portion define a continuous structure of the same electrical conductivity type.

17. The semiconductor memory device of claim 16 further comprising:
a common source region on the substrate wherein the common source region is electrically coupled to the first doped semiconductor regions of the first and second regions;
a first interconnection line wherein the first variable resistance memory element and the first transistor structure are electrically coupled in series between the first interconnection line and the common source region; and
a second interconnection line wherein the second variable resistance memory element and the second transistor structure are electrically coupled in series between the second interconnection line and the common source region, wherein the first and second interconnection lines are orthogonal with respect to the first and second word lines.

18. The semiconductor memory device of claim 16 further comprising:
an interconnection line electrically coupled to the first doped semiconductor regions of the first and second transistor structures wherein the interconnection line extends in a direction that is orthogonal with respect to the first and second word lines;
a first conductive structure on a sidewall of the first transistor structure adjacent the first doped semiconductor region of the first transistor structure;
a first dielectric layer between the first conductive structure and the first transistor structure;
a second conductive structure on a sidewall of the second transistor structure adjacent the first doped semiconductor region of the second transistor structure; and
a second dielectric layer between the second conductive structure and the second transistor structure.

19. A semiconductor memory device comprising:
a substrate;
first and second transistor structures spaced apart on the substrate wherein each of the first and second transistor structures includes first and second doped semiconductor regions and a semiconductor channel region between the first and second doped semiconductor regions with the first doped semiconductor region, the semiconductor channel region, and the second doped semiconductor region being aligned in a direction normal to a surface of the substrate and with the first doped semiconductor region being between the second doped semiconductor region and the substrate;
a first gate on a sidewall of the first transistor structure adjacent the semiconductor channel region of the first transistor structure;

a second gate on a sidewall of the second transistor structure adjacent the semiconductor channel region of the second transistor structure;

a first variable resistance memory element electrically coupled to the second doped semiconductor region of the first transistor structure with the first transistor structure being between the first variable resistance memory element and the substrate;

a second variable resistance memory element electrically coupled to the second doped semiconductor region of the second transistor structure with the second transistor structure being between the first variable resistance memory element and the substrate; and a common source on the first and second variable resistance memory elements so that the first transistor structure and the first variable resistance memory element are electrically coupled in series between the common source and a first interconnection line, and so that the second transistor structure and the second variable resistance memory element are electrically coupled in series between the common source and a second interconnection line.

20. The semiconductor memory device of claim 16 wherein the semiconductor channel regions of the first and second transistor structures and the connecting portion define a continuous semiconductor structure of the same electrical conductivity type.

21. The semiconductor memory device of claim 16 wherein the semiconductor channel regions of the first and second transistor structures and the connecting portion define a continuous semiconductor structure of the same p-type electrical conductivity type.

\* \* \* \* \*